(12) United States Patent
Bonora et al.

(10) Patent No.: US 7,585,144 B2
(45) Date of Patent: Sep. 8, 2009

(54) VARIABLE LOT SIZE LOAD PORT

(75) Inventors: Anthony C. Bonora, Portola Valley, CA (US); Michael Krolak, Los Gatos, CA (US); Roger G. Hine, Menlo Park, CA (US); Theodore W. Rogers, Alameda, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 11/774,764

(22) Filed: Jul. 9, 2007

(65) Prior Publication Data
US 2008/0008564 A1 Jan. 10, 2008

Related U.S. Application Data

(60) Provisional application No. 60/819,602, filed on Jul. 10, 2006.

(51) Int. Cl.
*B65G 49/07* (2006.01)
(52) U.S. Cl. .................. 414/411; 414/217; 414/939
(58) Field of Classification Search .............. 414/217, 414/935, 940, 411, 416
See application file for complete search history.

(56) References Cited

U.S. PATENT DOCUMENTS

| | | | |
|---|---|---|---|
| 5,653,565 A * | 8/1997 | Bonora et al. ............. | 414/411 |
| 6,071,059 A | 6/2000 | Mages et al. ............. | 414/411 |
| 6,220,808 B1 | 4/2001 | Bonora et al. | |
| 6,379,096 B1 * | 4/2002 | Beutler et al. ............. | 414/281 |
| 6,382,896 B1 | 5/2002 | Hu et al. .................. | 414/217 |
| 6,419,438 B1 | 7/2002 | Rosenquist ............... | 414/217 |
| 6,830,651 B2 | 12/2004 | Obikane | |

* cited by examiner

*Primary Examiner*—Charles A Fox
(74) *Attorney, Agent, or Firm*—Martine Penilla & Gencarella, LLP

(57) ABSTRACT

A variable lot size load port assembly is described having a tool interface, a port door, a latch key, an advance plate, and an elevator. The tool interface extends generally in a vertical dimension and has an aperture. The port door has a closed position wherein the port door at least partially occludes the aperture. The latch key extends from the port door and is configured to mate with a latch key receptacle of a door of a front opening unified pod (FOUP). The advance plate is configured to support a front opening unified pod (FOUP) and translate between a retracted position and an advanced position. The elevator raises and lowers the advance plate to bring the latch key receptacle of the door of the FOUP into alignment with the latch key of the port door.

7 Claims, 20 Drawing Sheets

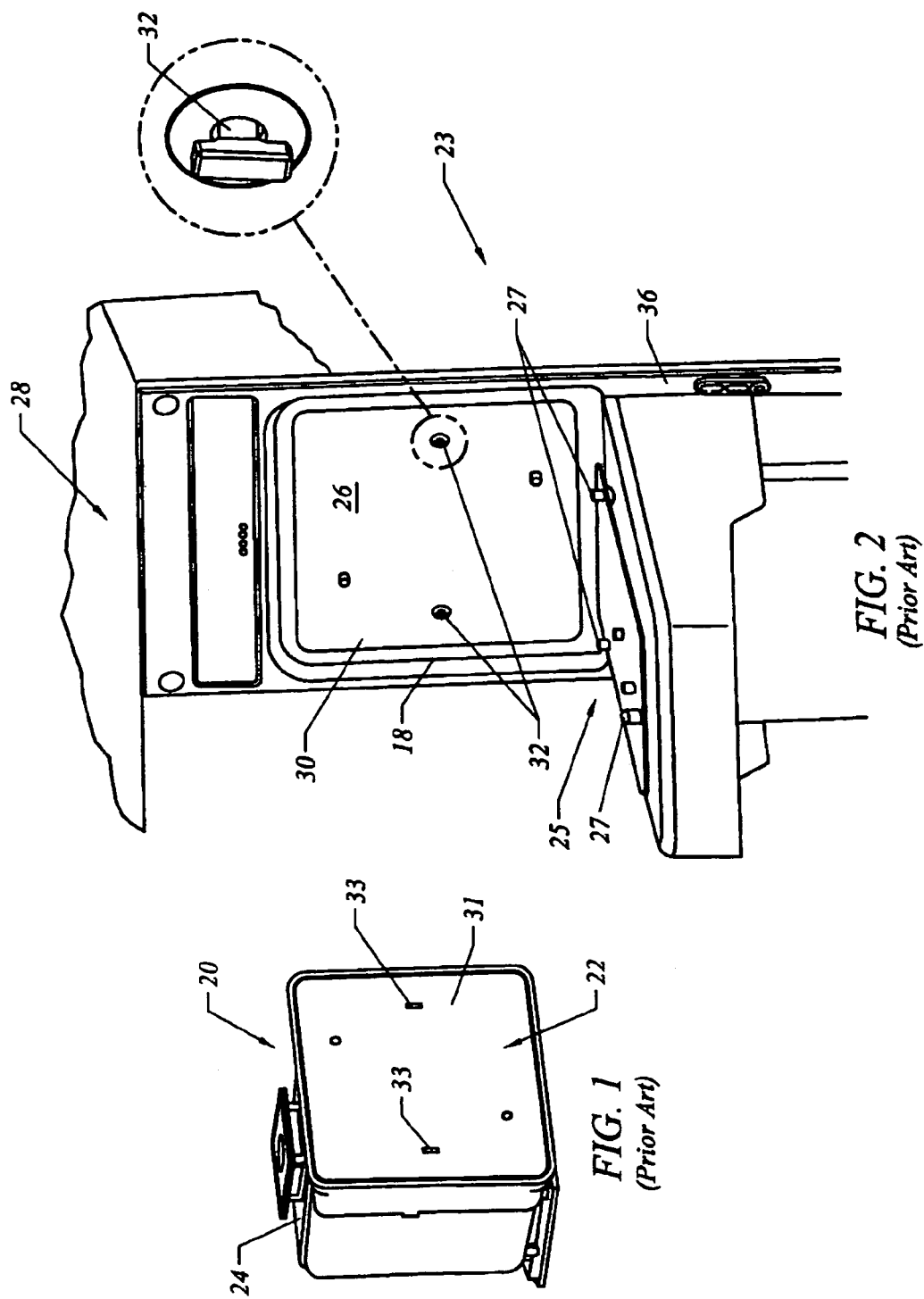

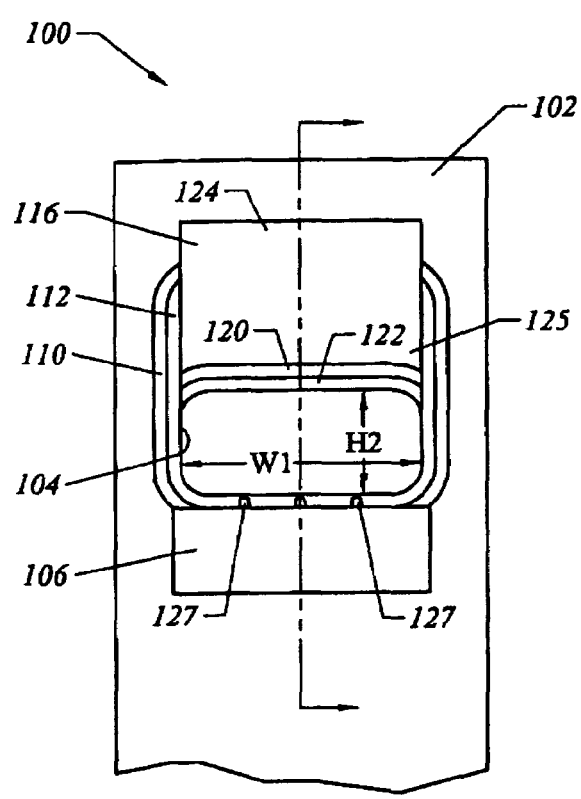
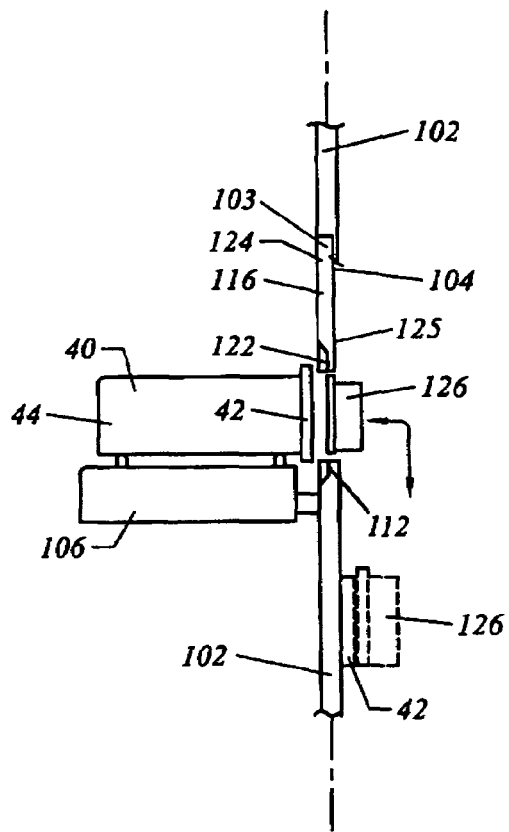
FIG. 6
FIG. 7

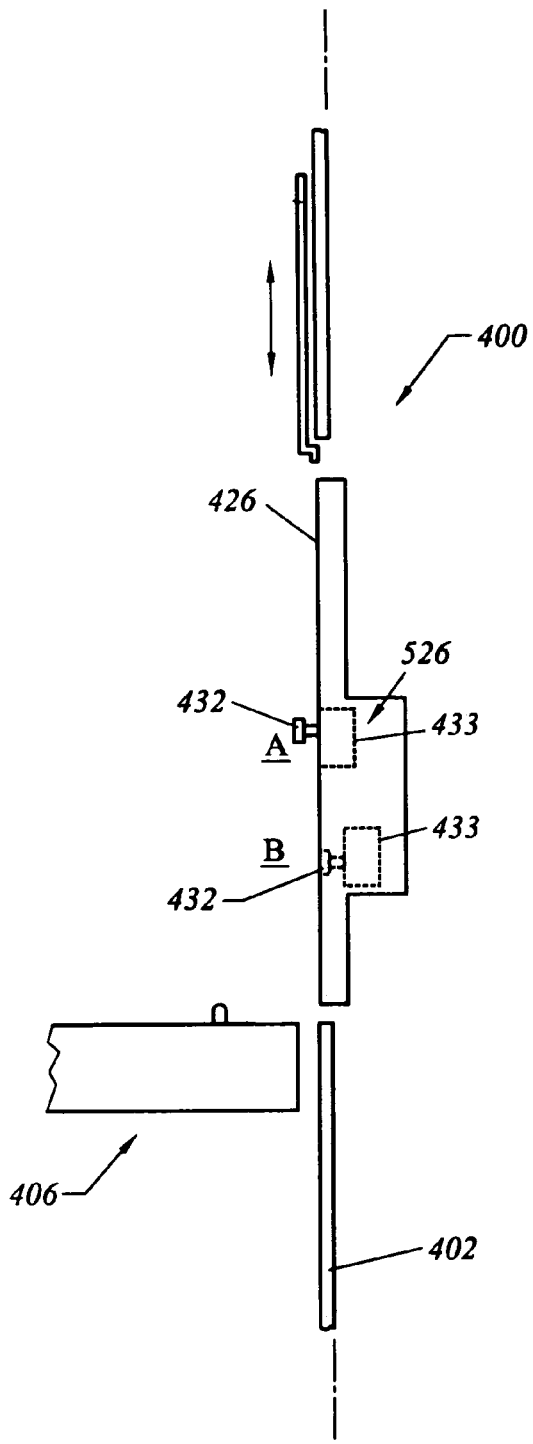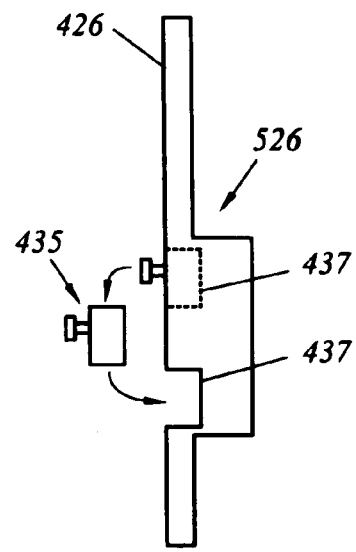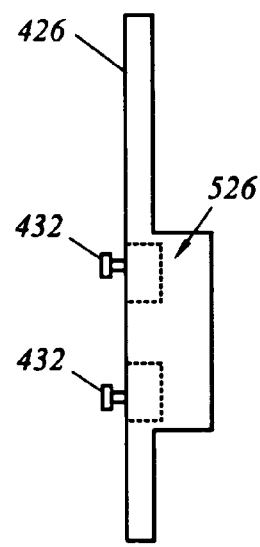
FIG. 25A
FIG. 25B
FIG. 25C

Advance plate 25 often includes three kinematic pins 27, or some other registration feature, which mate within corresponding slots on the bottom surface of FOUP 20 to define a fixed and repeatable position of the bottom surface of the FOUP on advance plate 25 and load port assembly 23.

VARIABLE LOT SIZE LOAD PORT

CLAIM FOR PRIORITY

The present application claims the benefit of earlier-filed and co-pending U.S. Provisional Patent Application 60/819,602, filed on Jul. 10, 2006, and entitled, "Variable Lot Size Load Port," which is incorporated herein by reference in its entirety.

CROSS-REFERENCE TO RELATED APPLICATIONS

The present application is related to U.S. patent application Ser. No. 11/774,750 and U.S. patent application Ser. No. 11/774,760, both of which are titled, "Variable Lot Size Load Port," are filed on the same day as the present application, and are incorporated by reference herein.

BACKGROUND

The present invention relates generally to wafer handling systems. Processing of semiconductor wafers generally requires transportation of wafers from one process station to another. Due to the sensitivity of semiconductor devices to contamination by particulates, it has become common practice to transport wafers in enclosed containers, referred to as front opening unified pods (FOUPs). The term, "FOUP" is used herein to broadly refer to containers having a front opening that are configured to transport substrates to and from process tools. The FOUP door mates with a port door of a processing unit, and the doors are removed providing access by the processing equipment to wafers held within the FOUP.

FIG. 1 illustrates a conventional 300 mm FOUP 20, which includes a mechanically openable FOUP door 22 and a shell 24, which together, defines a sealed environment for storing one or more workpieces located therein. FOUP door 22 includes a front face 31 with two latch key receptacles 33.

FIG. 2 illustrates a conventional 300 mm load port assembly 23 for transferring wafers between the FOUP 20 and a process tool 28. Load port 23 attaches to the process tool by a box opener/loader-to-tool standard interface (BOLTS) plate 36 that has an aperture 18. The load port 23 includes, among other things, a container advance plate 25 and a port door 26. In order to transfer the workpieces between FOUP 20 and process tool 28, FOUP 20 is manually or automatically loaded onto advance plate 25 so that front surface 31 of FOUP door 22 faces front surface 30a of port door 26 while FOUP 20 is seated on advance plate 25. Port door 26 occludes aperture 18 when in the closed position illustrated in FIG. 2.

The front surface 30a of port door 26 includes a pair of latch keys 32 that insert into the corresponding latch key receptacles 33 of FOUP door 22 as FOUP 20 is advanced towards the port door 26. An example of a door latch assembly within a FOUP door adapted to receive and operate with latch keys 32 is disclosed in U.S. Pat. No. 4,995,430, entitled "Sealable Transportable Container Having Improved Latch Mechanism," which is assigned to the Asyst Technologies, Inc., and is incorporated in its entirety by reference herein. In order to latch FOUP door 22 to the port door 26, FOUP door 22 is seated adjacent port door 26 so that vertically oriented latch keys 32 are received within latch key receptacles 33.

In addition to decoupling FOUP door 22 from the FOUP shell, rotation of the latch keys 32 also locks the keys into their respective receptacles 33; coupling FOUP door 22 to port door 26. A conventional load port includes two latch key 32, each of which are structurally and operationally identical to each other.

Referring to FIG. 3, advance plate 25 is translationally mounted to advance the FOUP 20 toward and away from the load port 30. Once a FOUP 20 is detected on the advance plate 25 by sensors in the load port assembly, FOUP 20 is advanced toward load port 30 in the direction of arrow A-A until front surface 31 of FOUP door 22 is proximate front surface 30a of port door 26 so that the flange of FOUP 20 forms a proximity seal with BOLTS plate 36. The proximity seal provides a small space between the BOLTS plate surrounding the port door and the FOUP shell flange at the front edge of the FOUP shell after the pod has advanced. This space allows air 19, which is at a higher than ambient pressure within the process tool to sweep away any particulates and prevent particulates from coming to rest on the flange. The proximity seal also ensures that particulates and other contaminants cannot enter the tool or the FOUP. The higher than ambient pressure is provided by a filter/blower system (not shown) attached to process tool 28 (FIG. 2).

It is desirable to bring the front surfaces of FOUP door 22 into contact with the front surface of port door 26 and maintain contact to trap particulates between the doors. Once the FOUP and port doors are coupled, horizontal and vertical linear drives within the load port assembly move the FOUP door 22 and port door 26 together into the process tool 28 so that wafers may thereafter be transferred between the interior of the pod 20 and interior of process tool 28. In the open position, port door 26 is translated away from aperture 18 so that it no longer occludes aperture 18. For example, port door 26 and FOUP door 22 may be moved in and then down alongside an interior surface of BOLTS plate 36.

Regardless of the desired relative positions of the FOUP and port doors after FOUP advance, it is necessary to precisely and repeatably control this relative positioning to ensure proper transfer of the pod door onto the port door and to prevent particulate generation. In order to establish the desired relative positions, conventional load port assembly systems rely on the fact that the kinematic pins establish a fixed and known position of the FOUP on the load port assembly so that, once seated on the kinematic pins, the FOUP may simply be advanced toward the load port a fixed amount to place the front surfaces of the respective doors in the desired relative positions.

Many of the components of the load port 30, such as the BOLTS plate aperture 18, the port door 26 and the container advance plate 25, are fixed components—cannot be adjusted. A 300 mm load port 30 is designed to operate only with 300 mm pods 20. Thus, there is a need for a load port that can accommodate and operate with various sizes of FOUPs.

SUMMARY

Broadly speaking, the present invention overcomes various limitations of existing load ports by providing a variable lot size load port as described herein. It should be appreciated that the present invention can be implemented in numerous ways, including as a process, an apparatus, a system, a device, or a method. Several inventive embodiments of the present invention are described below.

In one embodiment, a variable lot size load port assembly is provided having a tool interface, a port door, a latch key, an advance plate, and an elevator. The tool interface extends generally in a vertical dimension and has a front surface facing a front of the tool interface, a back surface generally parallel to the front surface, and an aperture. The port door has a closed position wherein the port door at least partially occludes the aperture and an open position wherein the aperture is substantially unobstructed by the port door. The latch key extends from the port door and is configured to mate with a latch key receptacle of a door of a front opening unified pod (FOUP). The advance plate positioned to the front of the tool interface below the aperture and extends generally horizontally. The advance plate is configured to support a front opening unified pod (FOUP) and translate between a retracted position and an advanced position, the advanced position being proximate the tool interface and the retracted position being spaced from the tool interface. The elevator raises and lowers the advance plate to bring the latch key receptacle of the door of the FOUP into alignment with the latch key of the port door. In this manner, a plurality of FOUPs of varying capacities, each having a latch key receptacle at a different elevation can be accommodated by the variable lot size load port assembly by varying an elevation of the advance plate.

In another embodiment, a variable lot size load port assembly includes a tool interface, an advance plate, and an upper and lower seal plate. The tool interface extends generally in a vertical dimension and has a front surface facing a front of the tool interface, a back surface generally parallel to the front surface, and an aperture. The advance plate is positioned to the front of the tool interface and below the aperture. The advance plate extends generally horizontally to support a front opening unified pod (FOUP) and is configured to translate between a retracted position a advanced position, the advanced position being proximate the tool interface and the retracted position being spaced from the tool interface. The upper seal plate has an upper end secured to the tool interface and a lower end covering a portion of the aperture, the upper seal plate being shaped to form a proximity seal with a front flange of the FOUP. The lower seal plate has a lower end secured to the tool interface and an upper end covering a portion of the aperture, the lower seal plate being shaped to provide a proximity seal with the front flange of the FOUP, the upper seal plate and the lower seal plate occluding upper and lower portions of the aperture to form a reduced aperture.

In yet another embodiment, a variable lot size load port assembly includes a tool interface, a port door, a latch key, an advance plate, and a replaceable static plate. The tool interface extends generally in a vertical dimension and has a front surface facing a front of the tool interface, a back surface generally parallel to the front surface, and an aperture. The port door has a closed position wherein the port door at least partially occludes the aperture and an open position wherein the aperture is substantially unobstructed by the port door. The latch key extends from the port door to mate with a latch key receptacle of a door of a front opening unified pod (FOUP). The advance plate is positioned to the front of the tool interface and below the aperture, extending generally horizontally. The advance plate is configured to support a front opening unified pod (FOUP) and translate between a retracted position a advanced position, the advanced position being proximate the tool interface and the retracted position being spaced from the tool interface. The replaceable static plate is mounted to the tool interface and occludes a perimeter portion of the aperture, the static plate having a reduced aperture, the reduced aperture having a size and shape to form a proximity seal with a FOUP of a selected capacity.

The advantages of the present invention will become apparent from the following detailed description, taken in conjunction with the accompanying drawings, illustrating by way of example the principles of the invention.

BRIEF DESCRIPTION OF THE DRAWINGS

FIG. 1 is an isometric view of an embodiment of a FOUP, according to the prior art;

FIG. 2 is an isometric view of one embodiment of a load port, according to the prior art;

FIG. 6 is a front view of another embodiment of a load port;

FIG. 7 is a schematic view an embodiment of a load port;

FIG. 25A, FIG. 25B and FIG. 25C are a schematic views of embodiments having a port door with retractable, repositionable or multiple latch keys;

DETAILED DESCRIPTION

Figure 4:
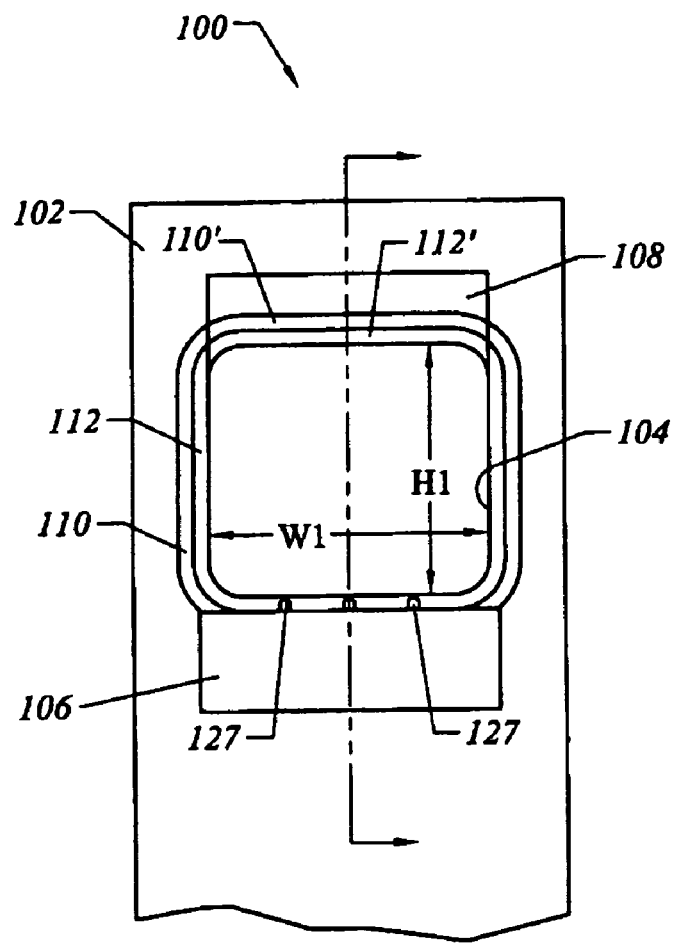
FIG. 4 is a front view of one embodiment of a load port.

FIGS. 4-6 illustrate a variable lot size load port 100 with static seal plates. In this embodiment, the load port 100 includes, among other things, a tool interface 102 having an aperture 104 and a container advance assembly 106. In one embodiment, tool interface 102 conforms to industry standards for a Box Opener/Loader to Tool Standard (BOLTS) interface, commonly referred to as a "BOLTS interface" or a "BOLTS plate." In one embodiment, the aperture 104 is sized to allow 300 mm wafers to pass through. A conventional tool interface 102 is preferably uniform in thickness. Here, the tool interface 102 has been modified to accept various sizes of seal plates for the purpose of adapting the tool interface to different capacity FOUPs as described in further detail below. In this embodiment, tool interface 102 has been machined to form a recessed surface 103, which provides a mounting surface for each seal plate (as described in more detail later).

Figure 5A:
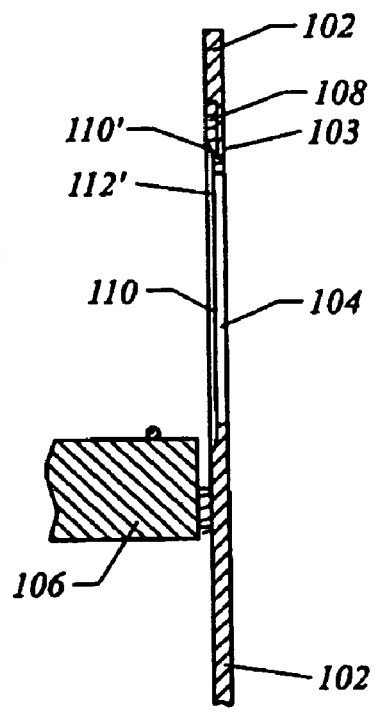
FIG. 5A is a side cross-sectional view of the load port shown in FIG. 4.
Figure 5B:
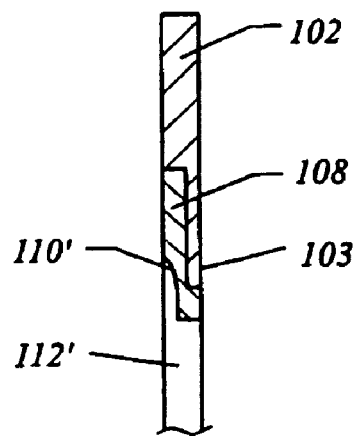
FIG. 5B is a detail of an upper portion of FIG. 5A.

FIG. 4 illustrates that the tool interface 102 includes a beveled surface that transitions into a recessed surface 112. FIGS. 5A and 5B show a cross section of the tool interface 102 in FIG. 4. The recessed surface 112 defines the perimeter of the plate aperture 104. Even though the FIGS. 4-5 embodiment of the load port 100 is designed to operate with a large capacity FOUP, a static seal plate 108 is mounted to the recessed surface 103. In one embodiment, the large capacity FOUP, contains, e.g., 25 wafers or substrates. In contrast, the small capacity FOUP described below with reference to FIGS. 6 and 7, can hold at most fewer wafers or substrates than the large capacity FOUP, e.g., 8 or 10 wafers or substrates. The smaller capacity FOUP is suitable for instances where smaller lot sizes are used, each lot size being a number of wafers or substrates being processed as a group. The small capacity FOUPs can therefore save considerable storage space when compared to using standard 25-wafer FOUPs for the smaller lot sizes, in which case each large capacity FOUP may be more than half empty.

To "reconstruct" the plate aperture 104 back into a uniform structure, the seal plate 108 includes its own beveled surface 110' that transitions to a recessed surface 112'. In a preferred embodiment, the beveled surfaces 110 and 110', and the recessed surfaces 112 and 112' are flush. The seal plate 108 may be affixed to the tool interface 102 with any type of fasteners (e.g., bolts, screws, etc.) or by other means (e.g., welded to the BOLTS plate). FIG. 4 illustrates that the plate aperture 104 has a height H1 and a width W1, which in a preferred embodiment, corresponds to the height and width of a conventional load port aperture.

FIG. 6 illustrates a seal plate 116. The seal plate 116, similar to the seal plate 108, is mounted to the recessed surface 103 of the tool interface 102. The seal plate 116 is used when the load port 100 operates with a small capacity FOUP 40 (FIG. 7). In this embodiment, the seal plate 116 includes a top portion 124 that mounts to the recessed surface 103 of the tool interface 102, and a distal end 125 that extends into the aperture 104. To "reconstruct" the plate aperture 104 to a size for accommodating a small capacity FOUP 40, the seal plate 116 includes its own beveled surface 120 that transitions to a recessed surface 122. In a preferred embodiment, the recessed surface 112 of the tool interface 102 and the recessed surface 122 of the seal plate 116 are flush. Similarly, the recessed surface 112 of the tool interface 102 and the recessed surface 122 of the seal plate 116 are preferably flush. The seal plate 116 may be affixed to the recessed surface 103 of the tool interface 102 with any type of fasteners (e.g., bolts, screws, etc.) or by other means (e.g., welded to the BOLTS plate). The tool interface 102 is not required to have a beveled and recessed surface. However, as shown in FIG. 7, the recessed surfaces 112, 122 allow FOUP 40 to move farther forward, which may be desirable.

The seal plate 116 reduces the size of the plate aperture 104 to operate with a small capacity FOUP 40. FIG. 6 illustrates that the height of the plate aperture 104 has been reduced to a height H2. When the seal plate 116 is affixed to the recessed surface 103 of the tool interface 102, the seal plate 116 effectively seals off the portion of the aperture 104 located above the recessed surface 122. In this embodiment, the width of the plate aperture remains at the same width W1, which corresponds to the width of a conventional load port aperture. The seal plate 116 may also reduce the width W1 of the plate aperture 104.

FIG. 7 provides a schematic representation of a small capacity FOUP 40 in operation with the load port 100 shown in FIG. 6. In this embodiment, a small capacity FOUP 40 is seated on the container advance assembly 106 and has been advanced towards the tool interface 102 to a position where the FOUP shell 44 makes a proximity seal with the recessed surface 122 of the seal plate 116 and the recessed surface 112 of the tool interface 102. The sealing plate 116 effectively seals off, or covers a portion of, the plate aperture 104. The seal plate 116 reduces the amount of exposure the interior of the processing tool has to the outside environment.

Figures 8, 9:
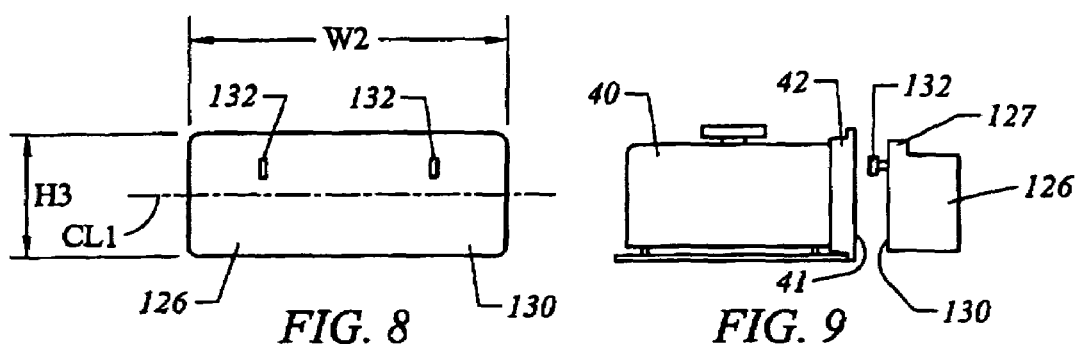
FIG. 8 is a front view of an embodiment of a port door.
FIG. 9 is a side view of the port door shown in FIG. 8 in operation with a small capacity container.

FIGS. 8-11 illustrate one embodiment of a port door 126 that may retain and remove both a small capacity FOUP door 42 and a large capacity FOUP door 22. The height of a large capacity FOUP door 22 is not the same as the height of a small capacity FOUP door 42. For one pair of latch keys 132 to operate with both types of FOUP doors, the latch keys 132 extending from the port door 126 cannot engage the center of both FOUP doors. The latch keys 132 preferably extend from the port door face 130 at an elevation between the center of the small capacity FOUP door 42 and the large capacity FOUP door 22. Here, the latch keys 132 are placed as high up on the port door face 130 as possible that is within the height of the small capacity FOUP door 42. FIG. 8 illustrates that the latch keys 132 extend from the port door 126 at an elevation above the centerline CL1 of the port door face 130 (having a height H3).

Figure 10:
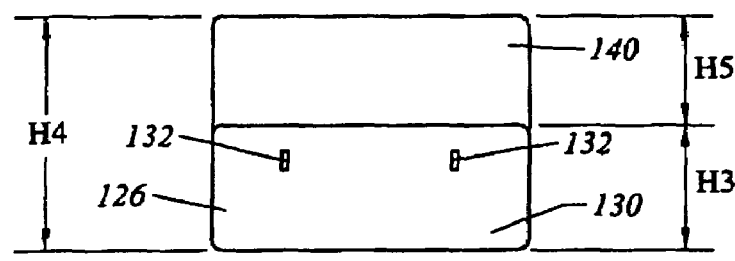
FIG. 10 is a front view of another embodiment of a port door.

FIG. 9 illustrates the port door 126 in operation with a small capacity FOUP 40. The FOUP door 42 includes latch key receptacles (not shown in FIG. 9) that align with the latch keys 132 when the FOUP is seated on a container advance assembly. As shown, the latch keys 132 do not engage the center of the FOUP door 42. FIG. 10 illustrates the port door 126 adapted to operate with a large capacity FOUP 20. The port door 126, in this embodiment, includes an extension plate 140. The extension plate 140 is preferably flush with the port door face 130, and may be secured to the port door 126 by any fastening devices known within the art. The height H5 of the extension plate 140 increases the effective height of the port door face 130 to a height H4. In a preferred embodiment, the height H4 is substantially similar to the height of a large capacity FOUP door 22.

Figure 11:
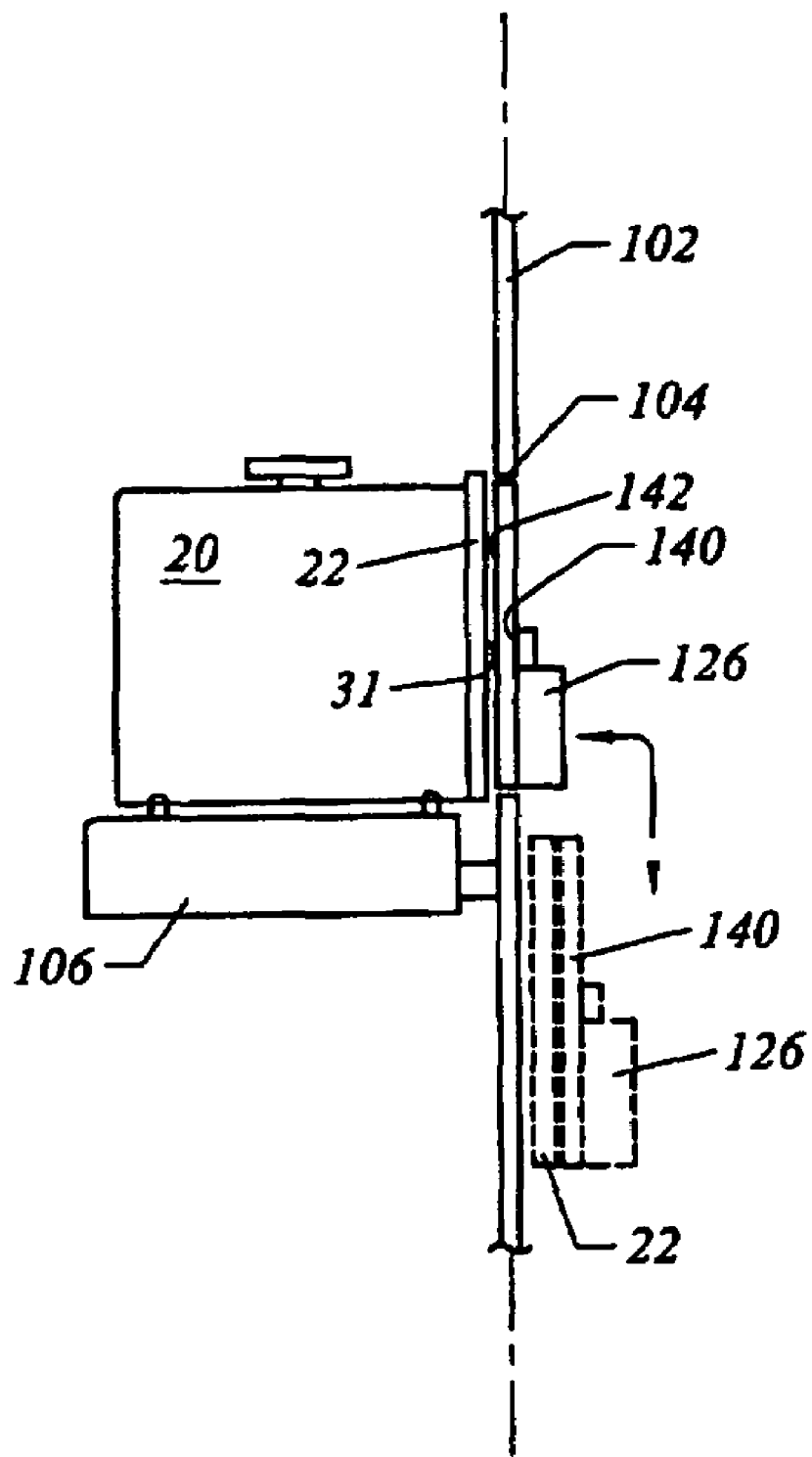
FIG. 11 is a schematic view of an embodiment of a load port, illustrating the port door shown in FIG. 10 in operation with a large capacity container.

FIG. 11 illustrates the port door 126 in operation with a large capacity FOUP 20. In particular, FIG. 11 illustrates that the port door face 130 and extension plate face 142 are substantially the same height (and surface area) as the FOUP door face 31. The latch key receptacles in the FOUP door 22, in this embodiment, are located below the center of the FOUP door in order to align with the latch keys 132 extending from the port door 126. After the latch keys 132 retain the FOUP door 22, the port door 126 moves the FOUP door 22 into the tool (shown in hidden lines).

If the port door 126 did not have the extension plate 140, an upper portion of the large capacity FOUP door face 31 would be exposed when the port door 126 is coupled to the FOUP door 22. If this upper surface of the FOUP door 22 was contaminated with particles, these particles could detach from the FOUP door 22 and possibly contaminate wafers being transferred between the FOUP 20 and the process tool. The extension plate 140 therefore traps particles on the FOUP door face 31 and prevents the particles from entering into the tool. The port door 126 with an extension plate 140 may also be used to retain and remove a small capacity FOUP door 42. When the port door 126 engages a small capacity FOUP door 42, the face 142 of the extension plate 140 will be exposed. The extension plate face 142 may have particles or contaminants on it that will not be trapped or contained by the FOUP door 42. But because the exposed face 142 of the extension plate 140 will face towards the interior of the tool interface 102 after the port door 126 and FOUP door 42 is lowered into the process tool, the opportunity for contaminating wafers is small (compared to having the exposed face of a FOUP door in the process tool).

Figures 12, 13:
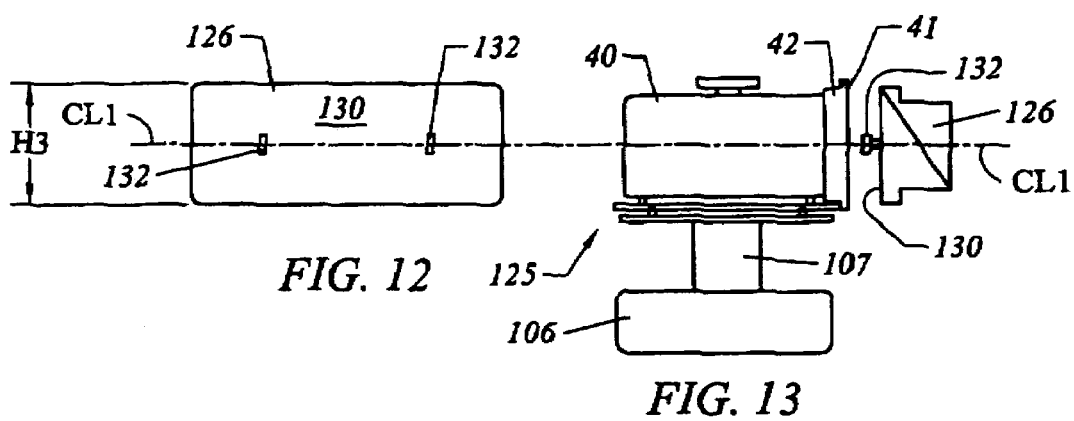
FIG. 12 is a front view of yet another embodiment of a port door.
FIG. 13 is a side view of the port door shown in FIG. 12 in operation with a small capacity container.
Figures 14, 15:
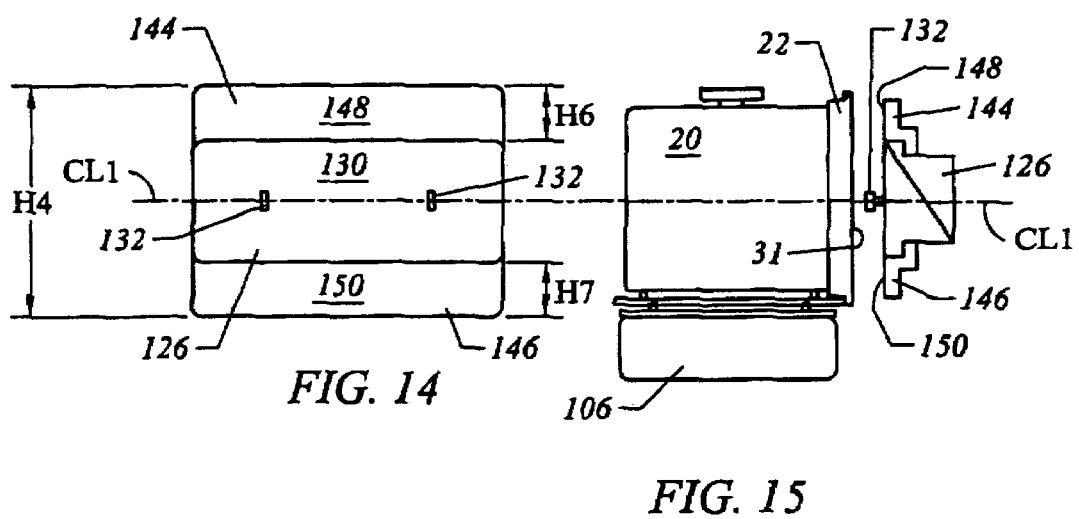
FIG. 14 is a front view of the port door shown in FIG. 12 adapted for use with a large capacity container.
FIG. 15 is a side view of the port door shown in FIG. 14 in operation with a large capacity container.

FIGS. 12-15 illustrate another embodiment of a port door 126 that may also operate with both a large capacity FOUP 20 and a small capacity FOUP 40. Again, the height of a large capacity FOUP door 22 shown in FIG. 15 is not the same as the height of a small capacity FOUP door 42 shown in FIG. 13. In contrast to the FIG. 8 embodiment, latch keys 132 extending from the port door 126 engage the center of both types of FOUP doors. The latch keys 132 extend from the centerline CL1 of the port door face 130. FIG. 13 illustrates the port door 126 in operation with a small capacity FOUP 40. The FOUP door 42 includes latch key receptacles (not shown in FIG. 9) that align with the latch keys 132 when the FOUP is seated on a container advance assembly. Thus, the latch keys 132 engage the center of the FOUP door 42.

Figure 16:
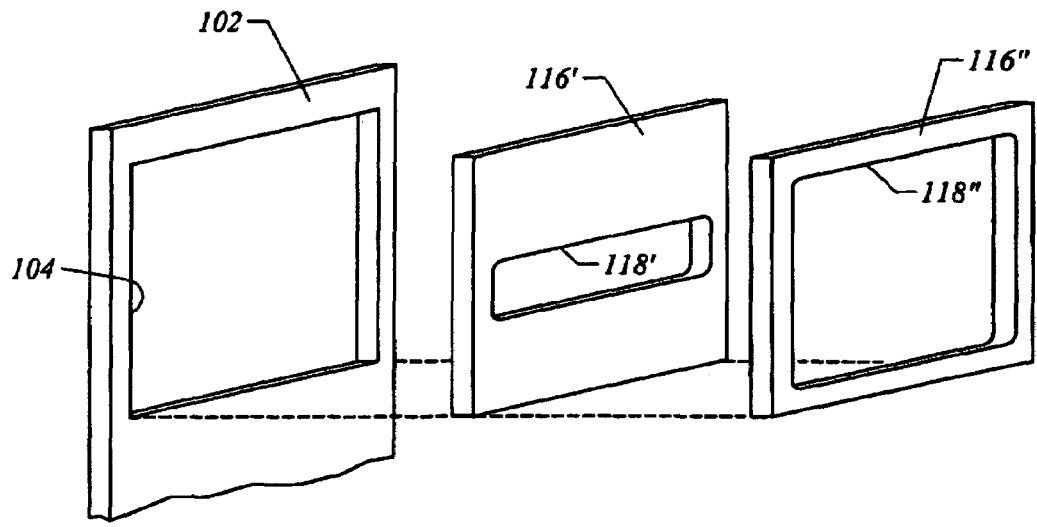
FIG. 16 is a perspective view of various embodiments of a static seal plate.

FIG. 13 also illustrates that the container advance assembly 106 has elevated the small capacity FOUP 40 (e.g., the center of the FOUP is higher than the standard 900 mm height), so that its latch key receptacles (not shown) are aligned with the latch keys 132. By way of example only, the port door 126 shown in FIG. 13 is a component of a load port that includes the seal plate 116' (as shown in FIG. 16).

The container advance assembly 106 may be vertically adjusted either automatically or manually by way of an elevator in order to align the latch key receptacles in the FOUP door 42 with the latch keys 132. In one embodiment, the elevator comprises an adapter 107 that may be manually added between the container advance assembly 106 and the container advance assembly 106 (as shown in FIG. 13). The adapter 107 may have precise features so that no adjustments are required after it is attached to the support plate 106.

Alternately, the container advance assembly 106 may be mounted to an automated elevator. For example, the load port may comprise a Direct Loading Tool, as disclosed in U.S. application Ser. No. 11/177,645, which is assigned to Asyst Technologies, Inc., and is incorporated in its entirety by reference herein. In this case, the Direct Loading Tool automatically adjusts the elevation of the container advance assembly 106 depending on whether the FOUP is a small capacity FOUP 40 or a large capacity FOUP 20.

FIGS. 14-15 illustrates the port door 126 adapted to operate with a large capacity FOUP 20. The port door 126, in this embodiment, includes a first extension plate 144 and a second extension plate 146. The face 148 of the extension plate 144 and the face 150 of the extension plate 146 are each preferably flush with the port door face 130. Each extension plate 144 and 146 may be secured to the port door 126 by any fastening devices known within the art. The height H6 of the first extension plate 144 and the height H7 of the second extension plate 146 increases the effective height of the port door face 130 to a height H4. In a preferred embodiment, the height H4 is substantially similar to the height of a large capacity FOUP door 22.

FIG. 15 illustrates the port door 126 in operation with a large capacity FOUP 20. FIG. 14 illustrates that the port door face 130, with the extension plates 144 and 146, are substantially the same height (and surface area) as the FOUP door face 31. The latch key receptacles in the FOUP door 22 are located at the center of the FOUP door 22 in order to align with the latch keys 132 extending from the port door 126. After the latch keys 132 retain the FOUP door 22, the port door 126 moves the FOUP door 22 into the tool.

Figure 17:
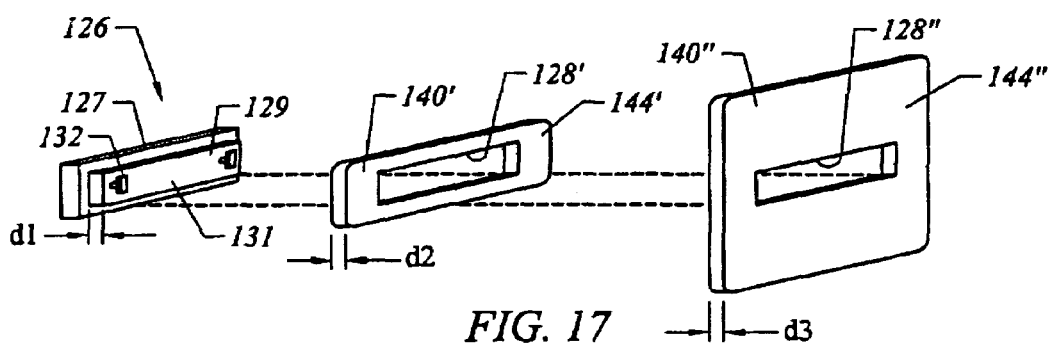
FIG. 17 is an isometric view of various embodiments of port door extension plates.
Figure 26:
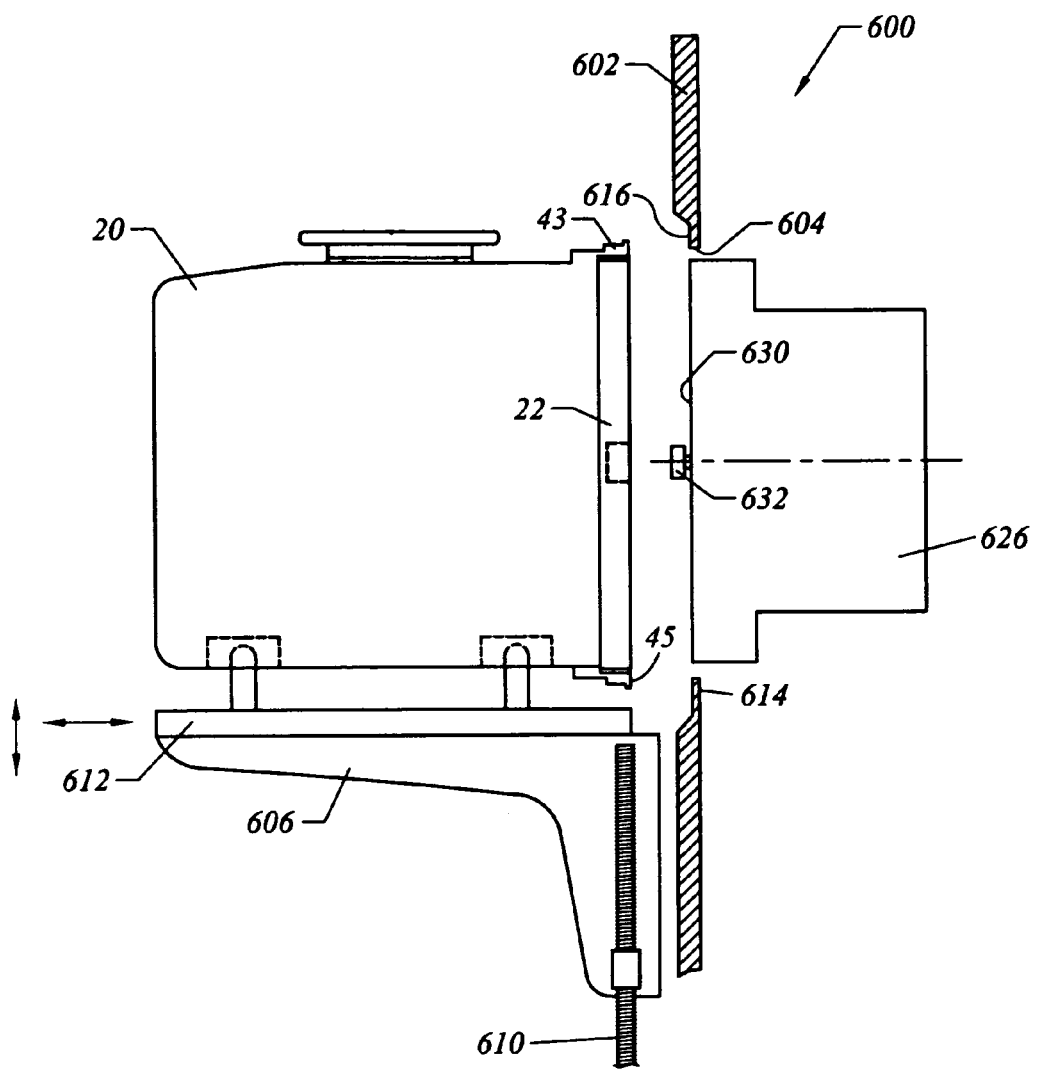
FIG. 26 is a schematic view of another embodiment.

FIGS. 16-17 illustrate other embodiments of a static seal plate. In these embodiments, each seal plate comprises a single plate with an opening sized to accommodate either a small capacity FOUP or a large capacity FOUP. Although not depicted here, each seal plate 116' or 116" may include recessed shoulders at the perimeters of apertures 118' and 118", e.g., as shown in FIG. 26 at 616 and 614. FIG. 16 illustrates the tool interface 102 with a plate aperture 104. The static seal plate 116' would be used when the load port will operate with a small capacity FOUP 40. The seal plate 116' mounts to the tool interface 102 within the plate aperture 104 by any means known within the art (e.g., bolts). The seal plate 116' reduces the size of the plate aperture 104 down to the size of the opening 118'. In this embodiment, the aperture 118' is located in the center of the seal plate 116'. The aperture 118' can be located in other locations in the seal plate 116'. FIG. 16 also illustrates a static seal plate 116". The seal plate 116" would be used when the load port will operate with a large capacity FOUP. The seal plate 116" mounts to the tool interface 102 within the plate aperture 104, and thus reduces the size of the aperture 104 to the size of the aperture 118". The aperture 118" in the seal plate 116" is centered in the seal plate 116". The aperture 118" may, of course, be located anywhere in the seal plate 116". In a preferred embodiment, the height and width of the seal plates 116' and 116" are identical so that the plates may be easily interchanged.

FIG. 17 illustrates various embodiments of an extension plate 140 for the port door 126. The extension plates 140' and 140" allow the port door 126 to operate with both a large capacity FOUP 20 and a small capacity FOUP 40. The port door 126 includes a base 127 and a raised latch key housing 129. The latch key housing 129, which has a depth d1, has a smaller perimeter than the perimeter of the base 127. The latch keys 132 extend from the latch key housing 129.

The extension plate 140' has a thickness d2 and includes an aperture 128'. The thickness d2 of the extension plate 140' is preferably equal to the depth d1 of the latch key housing 129. Thus, the extension plate face 144' is flush with the latch key housing face 131 when the extension plate 140' is secured to the port door 126. The surface area of the extension plate face 144' (plus the housing face 131) is preferably the same or similar to the surface area of the FOUP door face 41. The extension plate 140" has a thickness d3, and includes an aperture 128". The thickness d3 of the extension plate 140" is preferably equal to the depth d1 of the latch key housing 129. Thus, the extension plate face 144" is flush with the latch key housing face 131 when the extension plate 140" is secured to the port door 126. The surface area of the extension plate face 144" (plus the housing face 131) is preferably the same or similar as the surface area of the FOUP door face 31.

Figure 18:
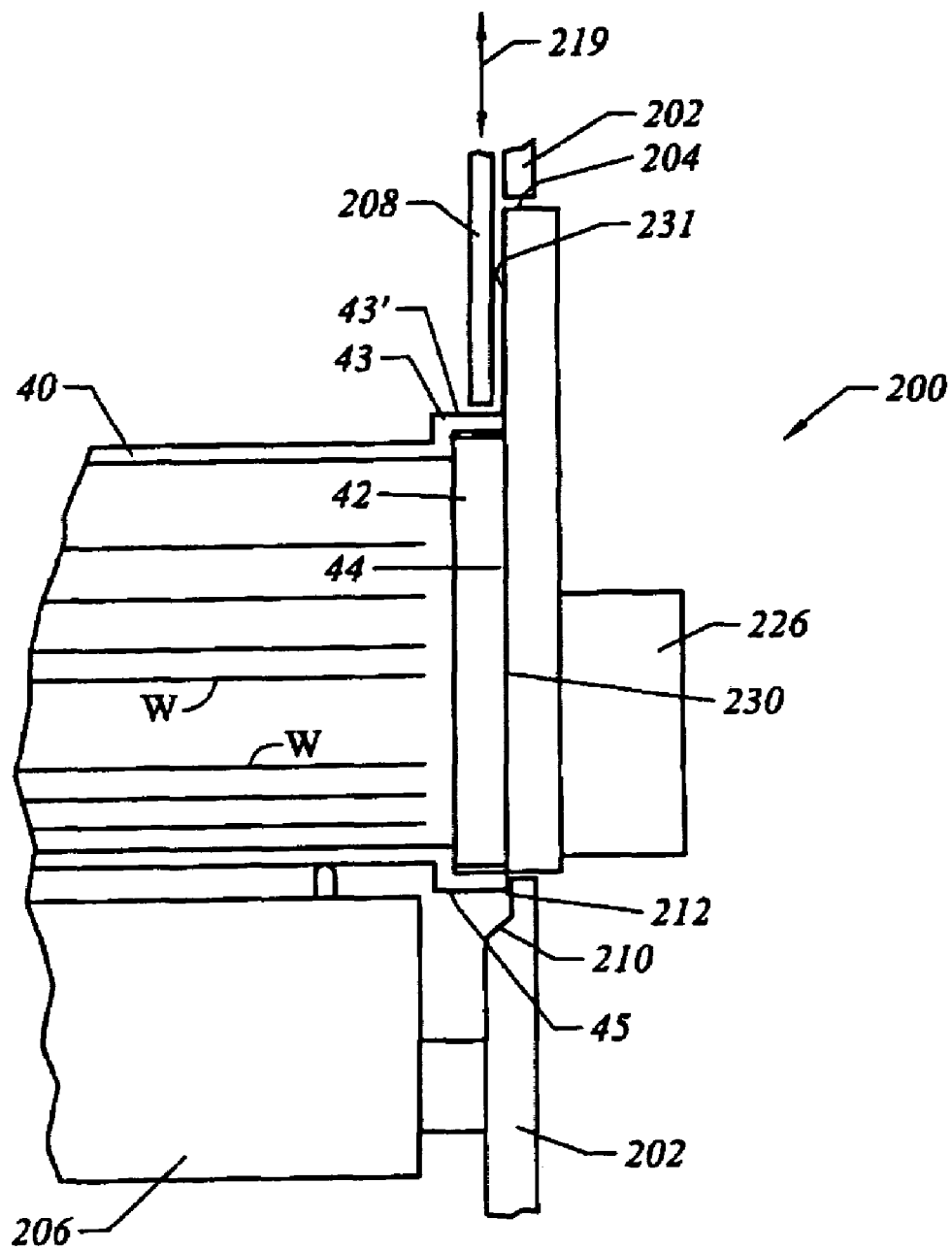
FIG. 18 is a schematic view of another embodiment.

FIGS. 18-25 illustrate various embodiments of an adjustable seal plate. FIG. 18 illustrates a load port 200. The load port 200 includes, among other things, a tool interface 202 with a plate aperture 204, a seal plate 208, a port door 226 and a container advance assembly 206. The seal plate 208 comprises a vertically adjustable seal plate. The tool interface 202 underneath the aperture 204 includes a beveled surface 210 that transitions into a recessed surface 212. The port door 226 shown in FIG. 18 is similar to the port door 126 illustrated in FIGS. 7 and 11. However, the load port 200 is not limited to this port door configuration.

In operation, the small capacity FOUP 40 is placed on the container advance assembly 206. The container advance assembly 206 moves the FOUP 40 towards the tool interface 202 to the position shown in FIG. 18. In this advanced position, the FOUP's top flange 43 is proximate to the port door 226 and the FOUP's bottom flange 45 is proximate to the recessed surface 212 of the plate (as shown in FIG. 18). The FOUP door face 44 is also located proximate to the port door face 230. The latch keys (not shown) then unlock and retain the FOUP door 42. It is also possible for the flanges 43 and 45 and/or the FOUP door 42 to contact the port door 226.

The port door 226, when located in the closed position (as shown in FIG. 18), occupies most of the aperture 204. The seal plate 208 is adjustable relative to the tool interface 202 in the direction of the arrow 219. The upper surface 231 of the port door face 230 is exposed to the ambient environment when the port door 226 is in the closed position and the seal plate 208 is located in an uppermost position (not shown). The seal plate 208 may be lowered to the position shown in FIG. 18 after the FOUP 40 has been moved to the advanced position, before the FOUP 40 is moved to the advanced position or while the FOUP 40 is being moved to the advanced position. The seal plate 208 is preferably moved to the position shown in FIG. 18 before the port door 226 is lowered into the tool. The seal plate 208 moves downward and forms a proximity seal with the top surface 43' of the FOUP's top flange 43 and covers the upper surface 231 of the port door face 230.

After the port door 226 retains the FOUP door 42, the port door 226 removes the FOUP door 42 and moves itself and the FOUP door 42 into the tool. The seal plate 208 preferably remains in the lowered position while the wafers are processed; preventing particles from entering into the tool. The seal plate 208 effectively reduces the size of the plate aperture 204. After the FOUP door 42 is returned to the FOUP 40, the container advance assembly 206 moves the FOUP 40 away from the tool interface 202. If the next FOUP placed on the assembly 206 is the same size, the seal plate 208 may remain in the lowered position. Or the seal plate 208 may retract in the direction 219, and is then lowered when the next FOUP is moved to the advanced position. The adjustable seal plate 208 may form a proximity seal with any size FOUP simply by being lowered proximate to the FOUP shell. Thus, the load port 200 may operate with various size FOUPs. One disadvantage to the load port 200 shown in FIG. 18 is that the port door 226 may strike the FOUP's top flange 43 when the port door 226 mates with the FOUP door 42.

Figure 19:
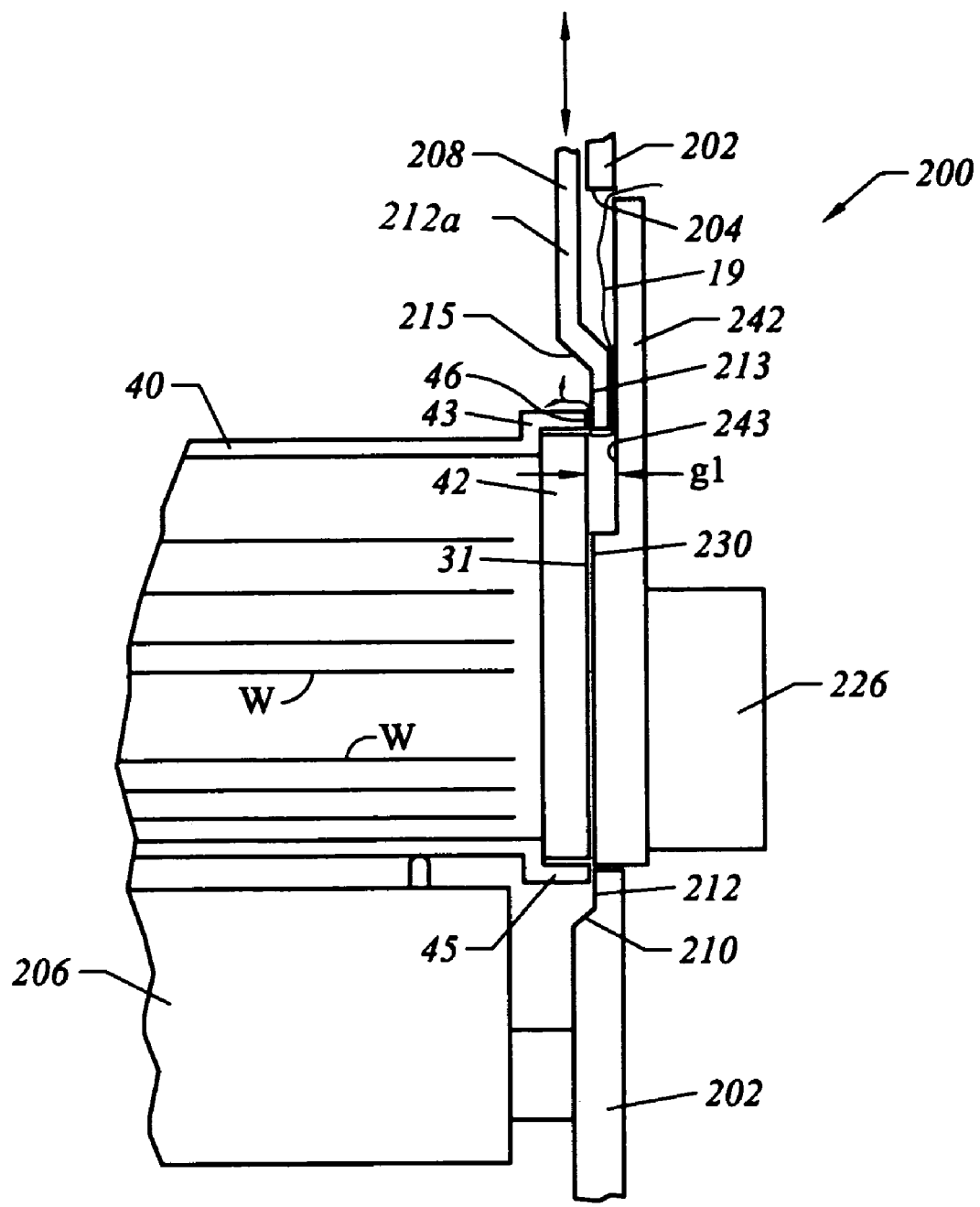
FIG. 19 is a schematic view of yet another embodiment.

FIG. 19 illustrates the load port 200 with another embodiment of an adjustable seal plate 208 and a port door 226. In this embodiment, the seal plate 208 includes a planar surface 212a, and a beveled surface 215 that transitions into a recessed surface 213. The seal plate 208 moves vertically with respect to the tool interface 202 (as shown by arrows in FIG. 19). The seal plate 208 forms a proximity seal with the front face 46 of the FOUP's top flange 43 when the FOUP 40 is located in the advanced position (as shown in FIG. 19). The FOUP's lower flange 45 forms a proximity seal with the recessed surface 212 of the tool interface 202. The proximity seals allow some air 19 to escape from the back side of tool interface 202, which is maintained at a higher than ambient pressure, thereby preventing particles and other contaminants from entering the process tool.

In operation, the FOUP 40 is placed on the container advance assembly 206. While the port door 226 is located in a closed position (as shown in FIG. 19), the FOUP 40 is moved forward to the position shown in FIG. 19. The seal plate 208 moves downward towards the FOUP 40 until the recessed surface 213 is located in front of, or adjacent to, the front surface 46 of the FOUP's upper flange 43. In a preferred embodiment, the seal plate 208 does not contact the port door 226. The air velocity through this proximity seal is preferably high enough to insure that any particle located on the FOUP shell's front surface 46 would be swept into the ambient environment and not into the tool.

To accommodate the seal plate's beveled surface 215 and recessed surface 213, the upper section 242 of the port door 226 has a recessed surface 243. The recessed surface 243 is set back from the port door face 230. A port door face typically covers substantially the entire FOUP door face when the port door and FOUP door are coupled to trap the particles on the FOUP door and port door. FIG. 19 illustrates that the port door face 230 does not cover the entire FOUP door face 31 when the port door 226 retains the FOUP door 42. Thus, the port door 226 does not strike the FOUP's top flange 43. The recessed face of the port door creates a gap g1 between the port door's recessed surface 243 and the FOUP door face 31. The Gap g1 is preferably as small as possible. The gap g1 is determined by the thickness of the tool interface 202 and the seal plate 208. Thus, the thickness of the seal plate 208 and the tool interface 202 are preferably as thin as possible to minimize the distance g1 between the port door face 243 and the FOUP door face 31.

Even though the recessed surface 243 and the FOUP door face 31 are not flush when the port door 226 is coupled to the FOUP door 42, any particles on the exposed portions of the port door 226 or FOUP door 42 should not cause contamination of the wafers stored in the FOUP 40. The laminar flow of clean air traveling within the process tool typically travels vertically from the top of the tool to the bottom of the tool. After the port door 226 moves the FOUP door into the tool, this laminar air flow will prevent the particles within the gap g1 from migrating upwards to the wafers W. In addition, the port door's upper section 242 provides a barrier preventing particles within the gap g1 from moving directly into the interior of the tool's clean area. The port door's upper section 242 basically shields the FOUP door face 31 from local air turbulence that could dislodge particles on the FOUP door face 31.

Figure 20:
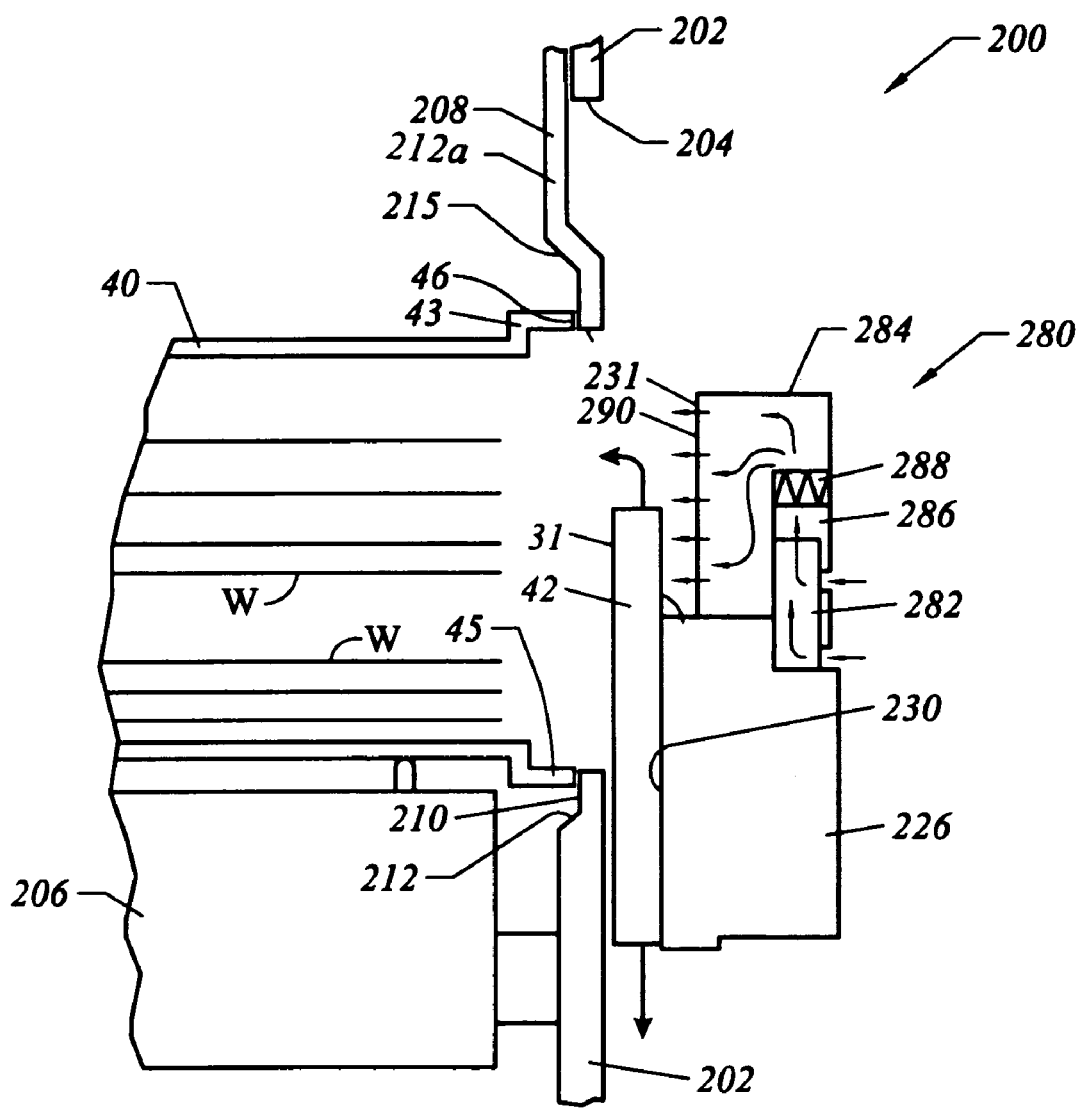
FIG. 20 is a schematic view of the load port shown in FIG. 19, with an optional filter attached to the port door.

FIG. 20 illustrates a blower system 280 that may be incorporated into the port door 226, which is shown latched to port door 226 at an intermediate position between the open position and the closed position. The blower system 280 improves the cleanliness of the portion of the port door 226 that is exposed to the outside or ambient environment. The blower system 280, in this embodiment, includes a blower or fan 282 attached to a housing 284 with an inlet 286, and a filter 288 for filtering the air before it enters the housing 284. The blower system 280 creates an air flow (as shown by arrows in FIG. 20).

The exit 290 of the blower housing 284 preferably comprises a perforated or porous surface so that gas (e.g., air, nitrogen, etc.) exits the housing and travels towards the outside environment. The filter 288 may comprise a removable module or an integral part of the blower system 280. Other devices for creating air flow are also possible. By forcing clean air out of the housing 284 through the exit surface 290 (see arrows), the number of particles that attach to the exit surface 290 is minimized, thereby reducing contamination of the clean area inside the process tool. Alternatively, air may be pulled into the housing 284 (opposite direction of arrows shown in FIG. 20) through the exit surface 290, also minimizing the number of particles entering into the tool.

The blower system 280 does not require a fan 282 or a filter 288. The cleanliness of the exit surface 290 may rely solely on the air flow created by the higher pressure gas within the processing tool exiting into the outside environment. When the exit surface 290 of the blower housing 284 is exposed to the outside environment, and therefore susceptible to particle contamination, the pressure differential would force the clean air from within the process tool through the exit surface 290 and to the outside environment.

Figure 21:
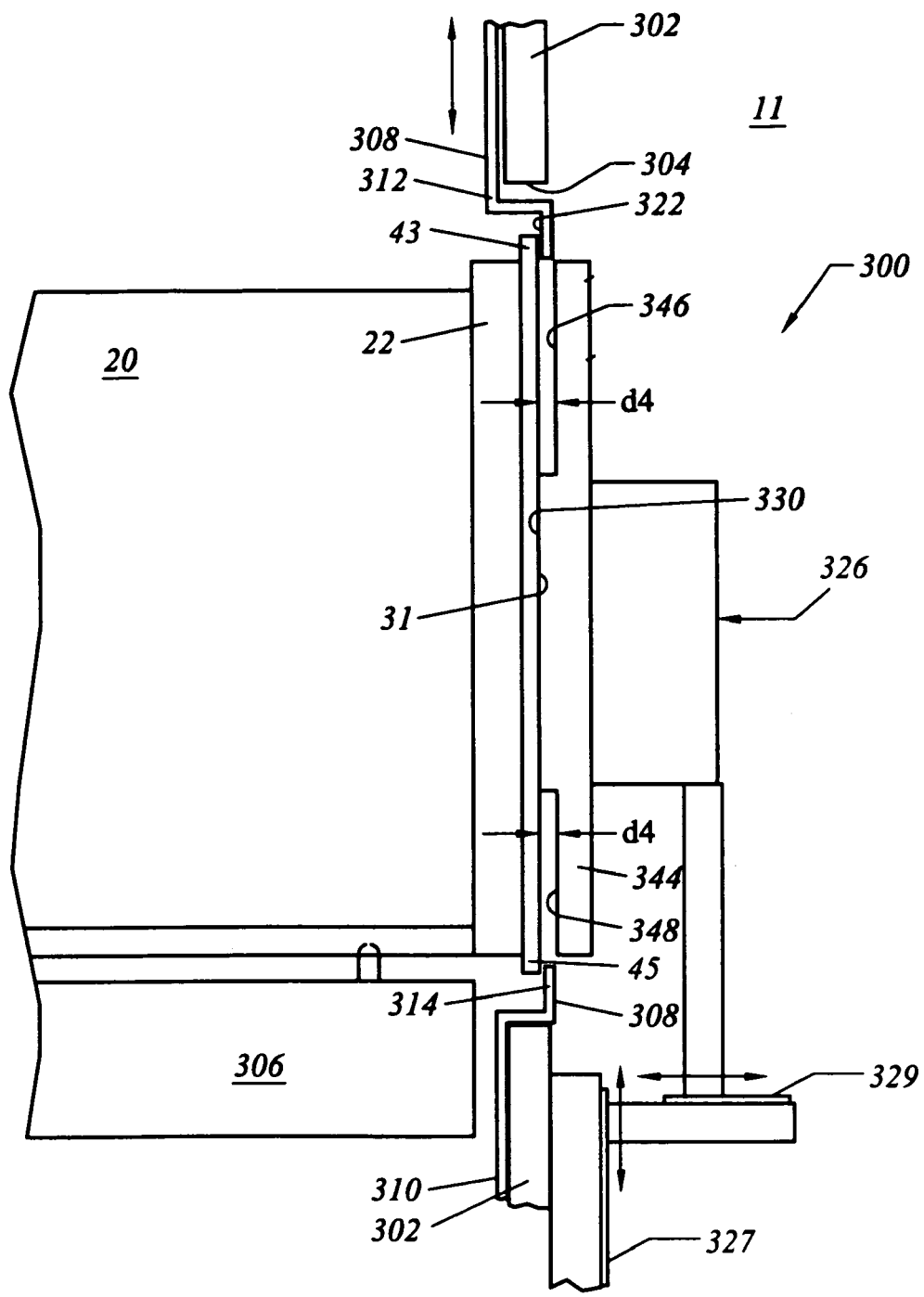
FIG. 21 is a schematic view of still another embodiment.
Figure 22:
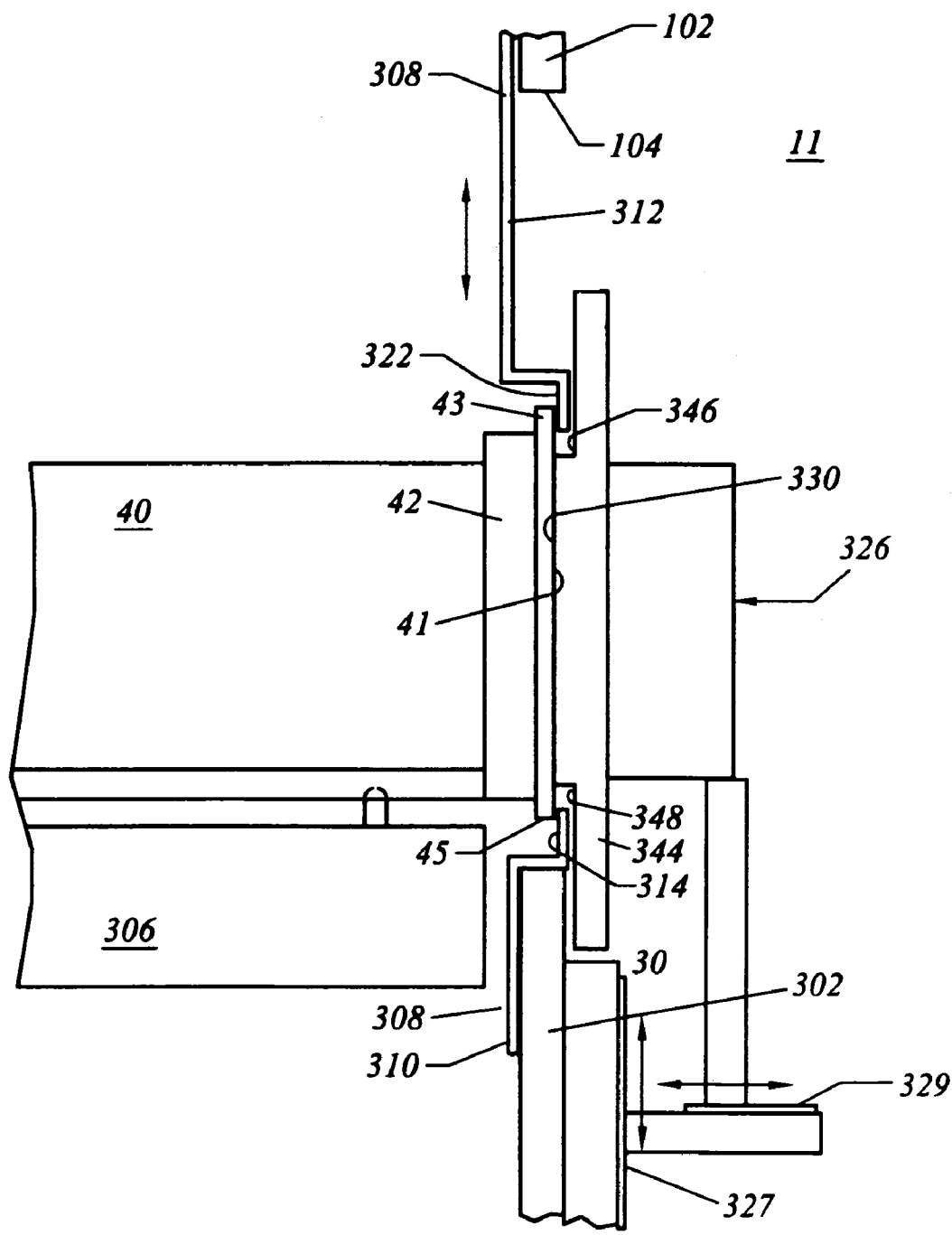
FIG. 22 is a schematic view of yet another embodiment.

FIGS. 21-22 illustrate yet another embodiment of an adjustable seal plate. The load port 300 includes, among other things, a plate 302 with an aperture 304, a seal plate 308, a container support assembly 306 and a port door 326.

FIG. 21 illustrates the load port 300 in operation with a large capacity FOUP 20. The seal plate 308, in this embodiment, includes a stationary plate 310 and an adjustable plate 312. The adjustable plate 312 includes a recessed surface 322. The stationary plate 310 includes a recessed surface 314. The adjustable plate 312 moves vertically (shown by arrows) with respect to the plate 302. Moving the adjustable plate 312 controls the size of the plate aperture 304. The stationary plate 310 may also comprise a machined surface of the plate 302.

The adjustable plate's recessed surface 322 forms a proximity seal with the FOUP's upper flange 43. The recessed surface 314 of the stationary plate 310 forms a proximity seal with the FOUP's lower flange 45. FIG. 21 illustrates that the surface area of the port door surface 330 is not equivalent to the surface area of the FOUP door 22 even though the height of the port door is substantially equivalent to the height of the FOUP door. To accommodate the seal plate 308, the port door 326 includes a contact surface 330, a first recessed surface 346 and a second recessed surface 348. The latch keys (not shown) extend from the port door contact surface 330. The latch key receptacles in the FOUP door 22 (not shown) are preferably aligned with the latch keys while the FOUP is seated on the container advance assembly 306.

In operation, the FOUP 20 is seated on the container advance assembly 306 and the container advance assembly 306 moves the FOUP to an advanced position (as shown in FIG. 21). At this position, the FOUP's lower flange 45 makes a proximity seal with the recessed surface 314 of the stationary plate 310. The adjustable plate 312 moves downward towards the FOUP 20 until the recessed surface 322 makes a proximity seal with the FOUP's upper flange 43. The latch keys unlock and retain the FOUP door 22, and preferably pulls the FOUP door into contact with the contact surface 330. The port door contact surface 330 and the FOUP door face 31 are not required to be in direct contact with each other. The port door's recessed surfaces 346 and 348 are separated from the FOUP door face 31 by a distance d4. The distance d4 may vary. The distance d4 simply must be wide enough to allow the seal plate 308 to fit between the port door and the FOUP door.

FIG. 22 illustrates the load port 300 in operation with a small capacity FOUP 40. To accommodate a small capacity FOUP 40, the port door 326 has been lowered (compared to the position shown in FIG. 21) by way of z-axis actuator 327 until the latch keys align with the FOUP's latch key receptacles (which are preferably in the center of the FOUP door 42). Z-axis actuator 327 may be, for example, a lead-screw actuator for raising and lowering port door 326 to align latch key receptacles for a FOUP of a selected capacity. In one embodiment, z-axis actuator 327 is also used for moving port door 326 from the open and closed position, wherein when closed, the port door 326 at least partially occludes aperture 104 and when open, the aperture is substantially unobstructed by the port door, e.g., by lowering the port door to a position below and behind aperture 104. A y-axis actuator 329 is used to move port door (along with a FOUP door) into the interior of the process tool so that both the FOUP door and port door can be lowered without crashing into the BOLTS plate.

In the position shown in FIG. 22, the lower section 344 of the port door overlaps both the plate 302 and the stationary plate 310. The FOUP's lower flange 45 still forms a proximity seal with the stationary plate's recessed surface 314. The adjustable plate 312 moves downward until the recessed surface 322 forms a proximity seal with the FOUP's upper flange 43. The adjustable plate 312 effectively reduces the height of the plate aperture 304 to substantially the height of the FOUP 40 to prevent particles from entering into the tool 11. In this embodiment, the need for the port door's recessed surfaces is more apparent. The adjustable plate 312 translates between the FOUP's upper flange 43 and the port door's recessed surface 346. The stationary plate's recessed surface 314 fits between the FOUP's lower flange 45 and the port door's recessed surface 348.

In one embodiment, the port door's recessed surfaces 346 and 348 may comprise a perforated or porous surface. A perforated or porous surface would allow clean air to flow through each recessed surface to help minimize the amount of particles collected on the surfaces 346 and 348. Any device such as, but not limited to, a fan, a filter or the greater differential pressure from inside the process tool enclosure 11 may provide the necessary air flow.

Figure 23:
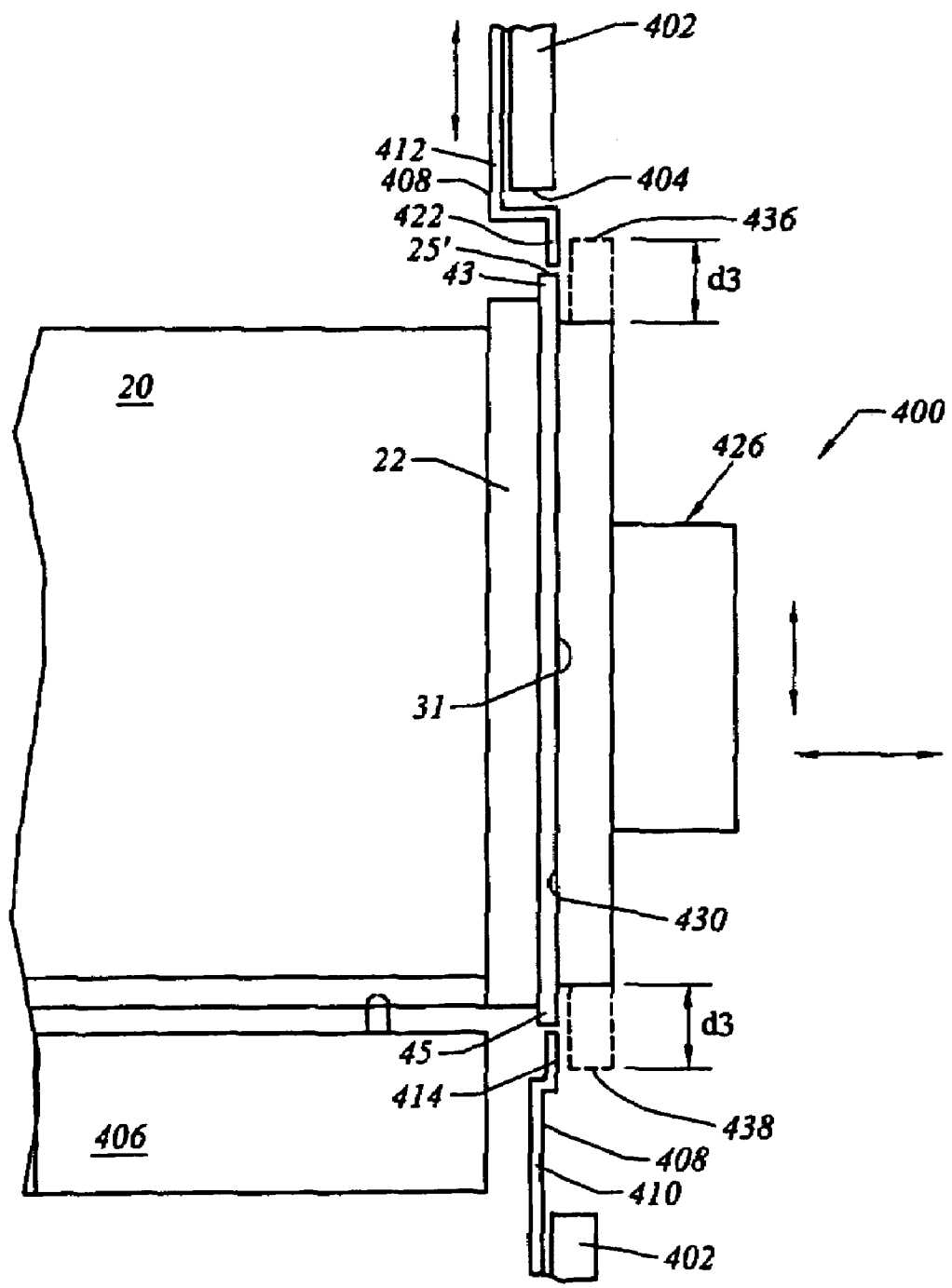
FIG. 23 is a schematic view of another embodiment.
Figure 24:
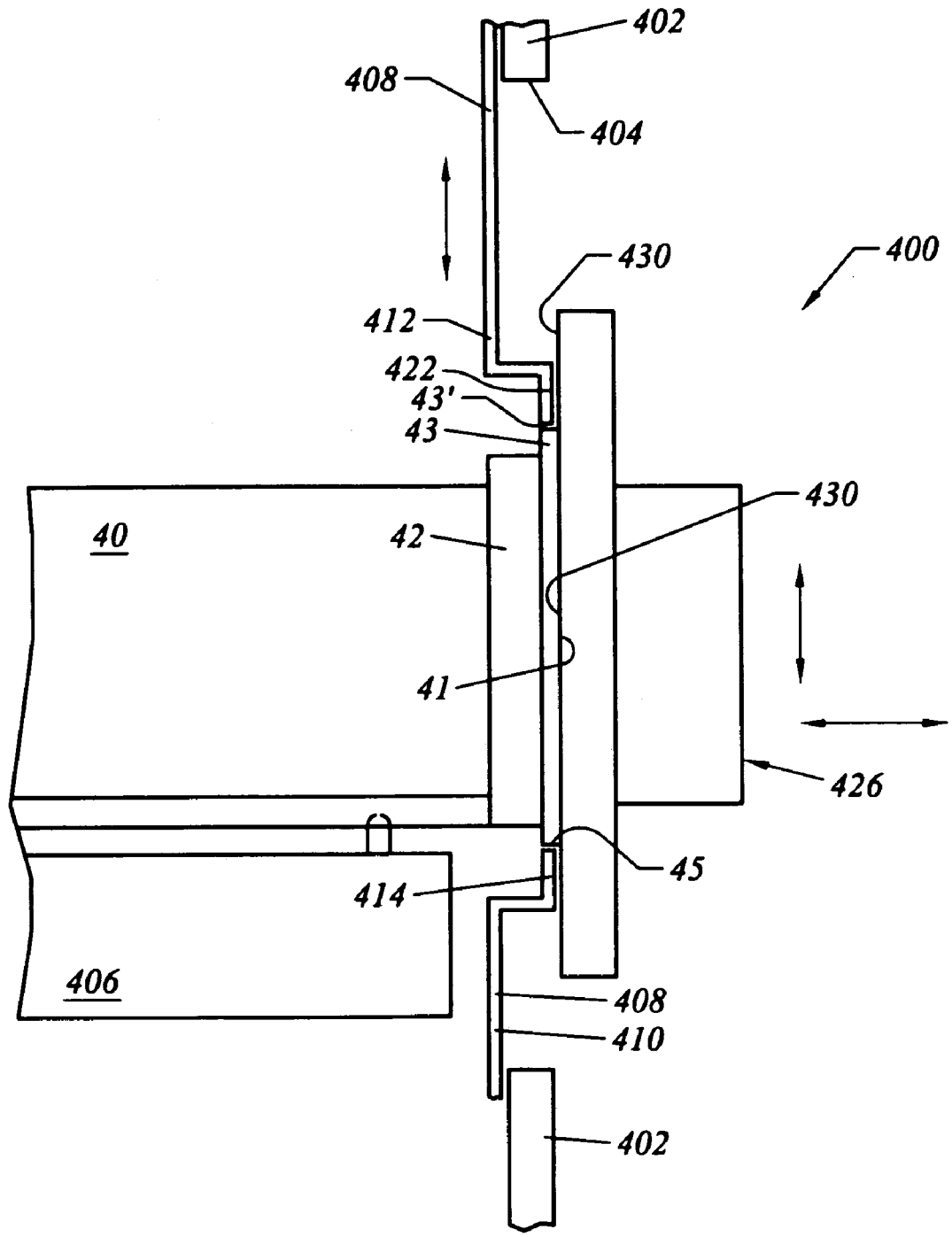
FIG. 24 is a schematic view of the load port shown in FIG. 23, in operation with a small capacity container.

FIGS. 23-24 illustrate a load port 400. The load port 400, in this embodiment, includes a plate 402 with a plate aperture 404, a container support assembly 406, a seal plate 408 and a port door 426. The seal plate 408 includes a stationary plate 410 having a recessed surface 414 and an adjustable plate 412 having a recessed surface 422. The port door 426 includes a front surface 430, and may include extensions 436 and 438 (as shown in hidden lines in FIG. 23). The extensions 436 and 438, in this embodiment, extend a length d3 from the port door 426. The extensions 436 and 438 may have other lengths. As will be described in more detail later, the adjustable plate 412 and the stationary plate 410 each form a proximity seal with the outer edge of the FOUP's upper flange 43 and lower flange 45 (as opposed to the front face of each flange as shown in the FIGS. 21-22 embodiments).

FIG. 23 illustrates the load port 400 in operation with a large capacity FOUP 20. In operation, a FOUP 20 is set on the container advance assembly 406, which moves the FOUP 20 towards the plate 402. When the FOUP 20 is in the position shown in FIG. 23, the stationary plate 410 forms a proximity seal with the FOUP's lower flange 45. The adjustable plate 412 may be vertically adjusted until the recessed surface 422 forms a proximity seal with the FOUP's upper flange 43. In this embodiment, the proximity seal between the seal plate 408 and the upper and lower flanges 43, 45 is formed with the outside surface of each flange—not the front surface of each flange (as shown in FIG. 21). For example, the recessed surface 422 of the adjustable plate 412 forms a proximity seal with the outer or top surface 25' of the upper flange 23. The recessed surface 414 of the stationary plate 410 forms a proximity seal with the lower flange 45.

In this embodiment, the port door 426 does not require any recessed surfaces to accommodate the adjustable plate 412 or the stationary plate 410. The front surface 430 of the port door 426 may be substantially the same height and surface area as the FOUP door 22. The port door 426 is more like a conventional port door, which will trap more particles between the port door front surface 430 and the FOUP door 22 when the FOUP door 22 and the port door 426 are coupled together.

The extension features 436 and 438 help prevent particles from entering into the process tool. Each extension plate overlaps slightly with the respective seal plate. The extension feature 436 overlaps slightly with the recessed surfaces 422 of the adjustable plate 412 to block or minimize air flow that will otherwise travel within the gap between the port door, the adjustable plate and the seal plate. The extension feature 438 overlaps slightly with the recessed surfaces 414 of the stationary plate 410 to block or minimize air flow that would otherwise travel within the gap between the port door, the stationary plate and the FOUP's lower flange 45. The extension features 436 and 438 are shown as rectangular structures, but may comprise any shape.

FIG. 24 illustrates the load port 400 in operation with a small capacity FOUP 40. The small capacity FOUP 40 is seated on the container advance assembly 406. The load port 400 does not need to be modified when, for example, a large capacity FOUP is removed from the container advance assembly 406 and then a small capacity FOUP 40 is placed on the container advance assembly, or vice versa. The surface area of the port door's front surface 430 is greater than the surface area of the port door 42. The port door's front surface 430 overlaps the recessed surface 422 of the adjustable plate 412 and the recessed surface 414 of the stationary plate 410 when the FOUP 40 is located in the advanced positions.

The seal plate 408 operates in the same manner as described in the FIG. 23 embodiment above. Once the FOUP 40 is moved to the position shown in FIG. 24, the outer surface 45' of the lower flange 45 forms a proximity seal with the recessed surface 414 of the stationary plate 410. The adjustable plate 412 may be adjusted downward until the recessed surface 422 forms a proximity seal with the outer surface 43' of the upper flange 43.

FIG. 25A illustrates a port door 526 with two sets of latch keys 432. The latch keys 432 are shown extending from the port door 526 at an elevation A and an elevation B. In this embodiment, only one set of latch keys 432 extend from the port door 526 at either elevation A or elevation B—not both elevations. For example, each set of latch keys may comprise a pair, wherein only one latch key from each pair is visible in FIG. 25A. FIG. 25B shows another embodiment in which a pair of latch keys 435 is repositionable from one pair of latch key receptacles at a first elevation and another pair of latch key receptacles at a second elevation. FIG. 25C shows yet another embodiment wherein latch keys 432 extend from the port door 426 at two different elevations at all times.

Figure 3:
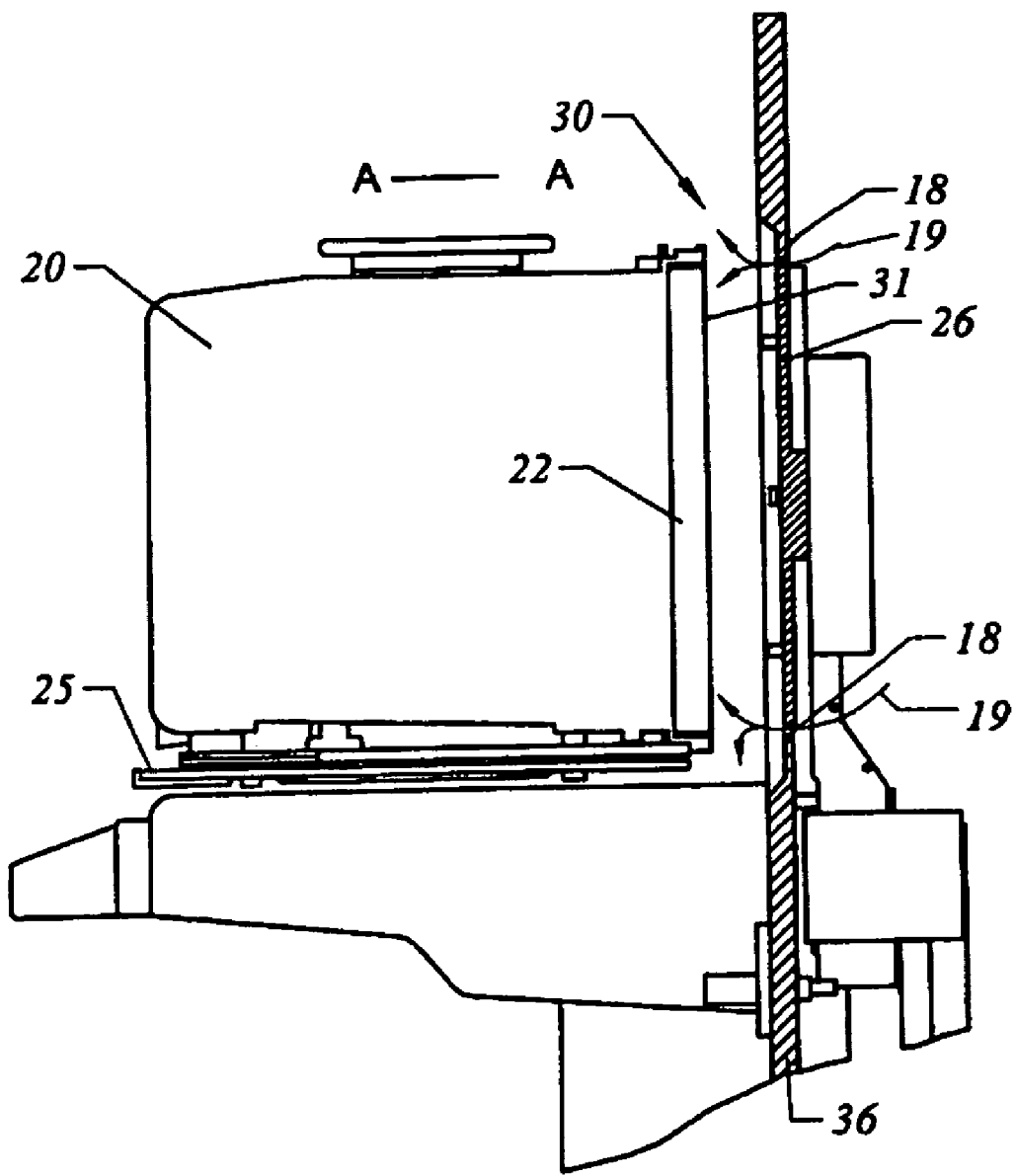
FIG. 3 is a side elevation view of the load port shown in FIG. 2, illustrating various components of the load port in a cross-sectional view.

Referring to FIG. 25A, elevation A corresponds to a preferred elevation when the load port 400 operates with a large capacity FOUP 20 (not shown in FIG. 25). Elevation B corresponds to a preferred elevation when the load port 400 operates with a small capacity FOUP 40. For example, elevation A may align with the vertical centerline of a large capacity FOUP door when a large capacity FOUP (see, for example, FIG. 3) is seated on the assembly 406. Likewise, elevation B may align with the vertical centerline of a small capacity FOUP door when a small capacity FOUP 40 is seated on the assembly 406. The vertical centerline for each FOUP door is the line extending in a horizontal direction that is positioned at midpoint between the top and the bottom of the FOUP door.

If only one set of latch keys 432 extend from the port door 426, the latch keys 432 may be moved between elevation A and elevation B either manually or automatically. In the automatic configuration shown in FIG. 25A, the pair of latch keys 432 may be extended or retracted by a mechanism 433. For example, latch key mechanism 433 in the port door 426 may be connected to a pivot mechanism (not shown) that would extend the pair of latch keys 432 at elevation A, and at the same time, retract the other pair of latch keys 432 at elevation B.

For manual configuration shown in FIG. 25B, the port door 426 may include four receptacles 437, each for receiving a latch key 435. Two receptacles 437 may be located at elevation A and two receptacles 437 would be located at elevation B. When a large capacity FOUP 20 is seated on the advance plate 106, a pair of latch keys 435 would be inserted into the receptacles 437 located at elevation A. If the next FOUP seated on the advance plate 106 is a small capacity FOUP 40, then latch keys 435 would be manually removed (e.g., by an operator) from the receptacles 437 located at elevation A and inserted into the receptacles 437 located at elevation B, e.g., as indicated by the arrows. In one embodiment, a single latch key drive mechanism drives all four receptacles all the time, regardless of which receptacles the latch keys 432 are inserted into. Only the pair of latch keys 432 extending from the port door 426 would interface with the latch key holes in the FOUP door.

The port door 426 may also have four latch keys 432 extending from the port door at all times as shown in FIG. 25C. A large capacity FOUP door would include four latch key receptacles for receiving the four latch keys. In one embodiment, only two of the four latch keys would operate at a time for unlocking and retaining the FOUP door. The other two latch keys would act as passive latch keys. If the pairs of latch keys are spaced far enough apart, a small capacity FOUP door may still only include two latch key receptacles, and only engage two of the four latch keys extending from the port door.

Each of the adjustable seal plates described above may also be used to prevent particles from contaminating the port door while the load port is waiting for a FOUP. A conventional load port, such as shown in FIG. 2, exposes the port door face 30 to the ambient environment while the load port is waiting for another FOUP. During this time, the port door 426 may collect contaminants or particles. To avoid or reduce port door contamination, the seal plate 208 shown in FIG. 18 (for example) could be left in a lowermost position when there is no FOUP seated on the support assembly 206. The seal plate 208 may be lowered until it contacts the recessed surface 210 of the tool interface 202. In this position, the seal plate 208 covers the port door face 230 while the load port 200 is not in operation and prevents particles from contacting the port door face 230. The seal plate 208 does not have to completely cover the port door face 230. The seal plate 208 may be lowered to partially cover the port door face 230. When a FOUP is loaded onto the support assembly 206, the seal plate 208 would be raised to correspond to the size of the FOUP.

Figure 27A:
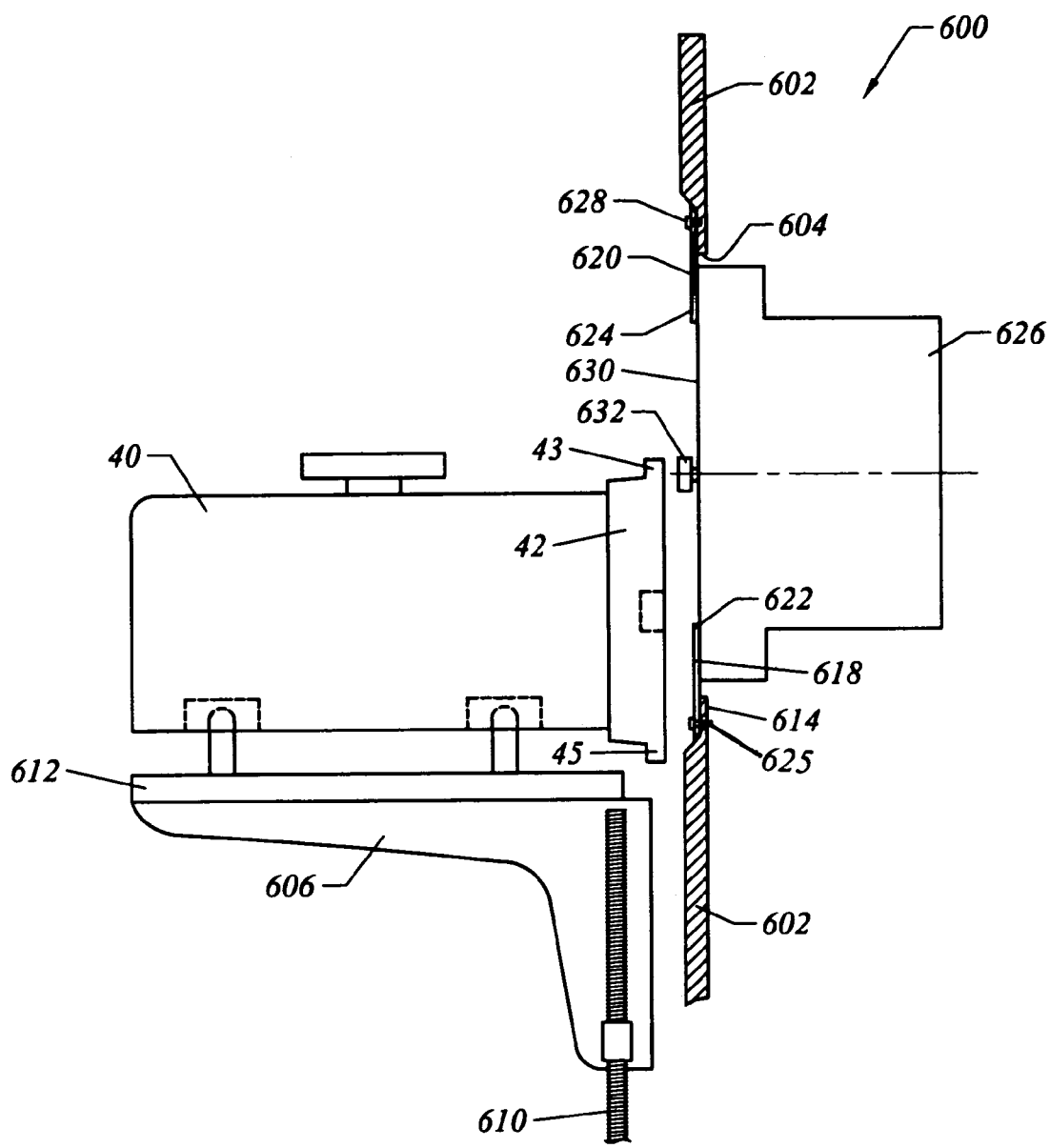
FIG. 27A is a schematic view of the load port shown in FIG. 26 in operation with a small capacity container.
Figure 27B:
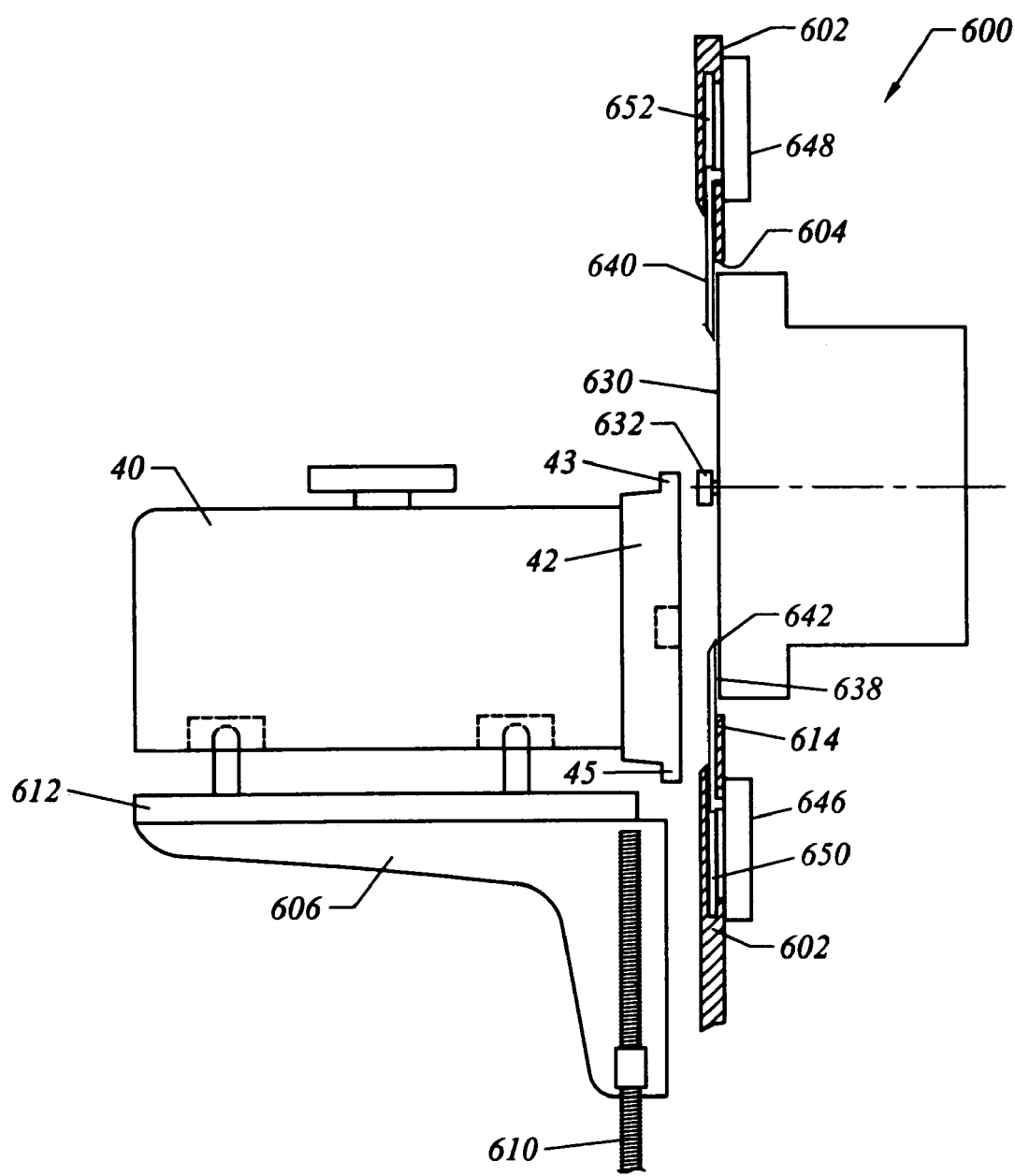
FIG. 27B is a schematic view of an alternate embodiment of the load port shown in FIG. 27A.
Figure 28:
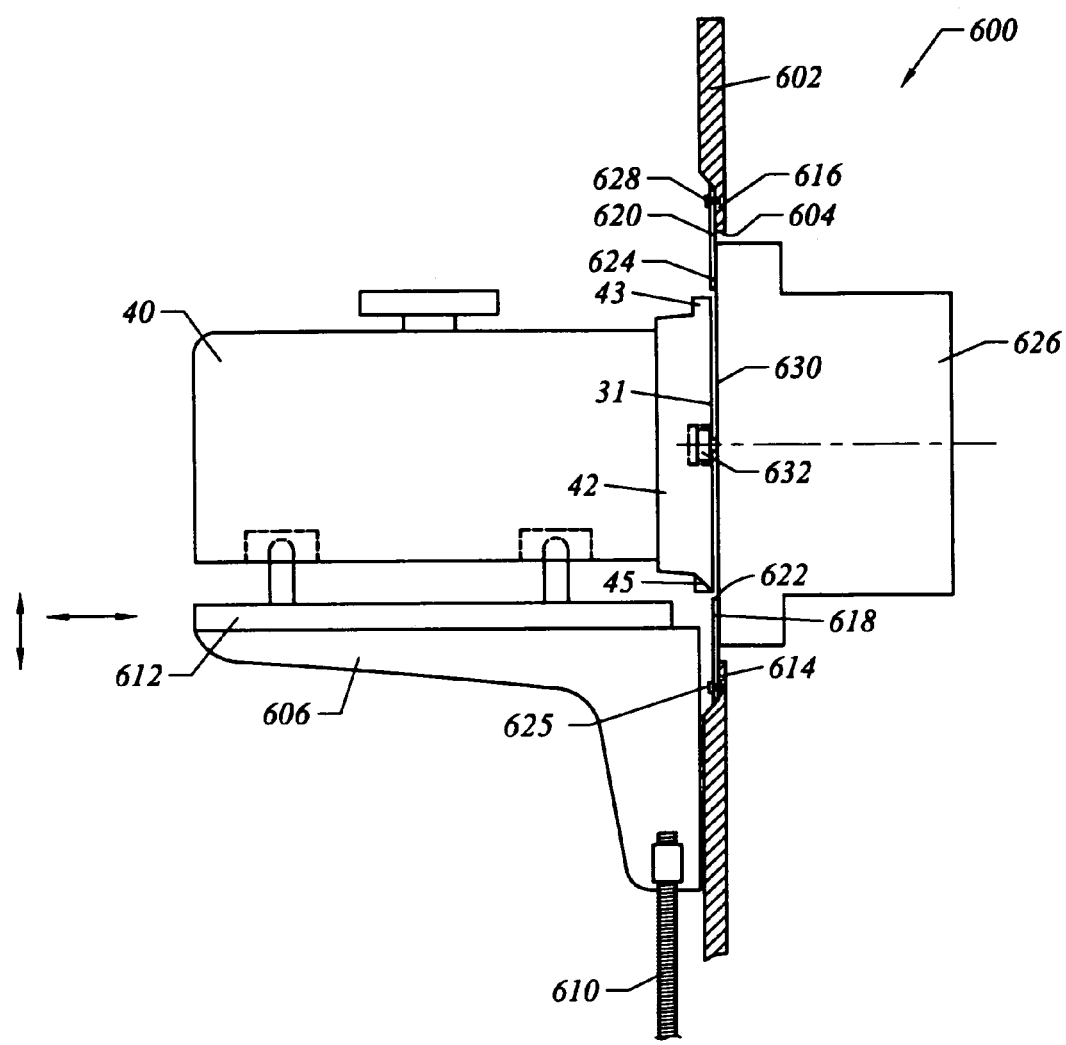
FIG. 28 is a schematic view of the load port shown in FIG. 27A, illustrating the small capacity container coupled to the port door.

FIGS. 26-28 illustrate a load port 600. The load port 600, in this embodiment, includes a plate 602 with a plate aperture 604, a container advance assembly 606 and a port door 626. The plate 602 includes a recessed surface (shown as a bottom surface 614 and a top surface 616 in the cross-sectional view). The port door 626 includes at least one latch key 632 extending from its front surface 630. In this embodiment, the container advance assembly 606 includes an elevator for vertical adjustment. A vertically adjustable container advance assembly allows the load port 600 to align the FOUP's latch key receptacles with the latch keys 632. In one embodiment, the elevator is implemented using a lead screw mechanism 610 (FIG. 26) for elevating container advance assembly 606. Lead screw mechanisms are well known within the art; therefore no further description is required. Other elevator mechanisms including, but not limited to, linear actuators, belt drives, and so on, may also be used to elevate container advance assembly 606 vertically.

FIG. 26 illustrates the load port 600 in operation with a large capacity FOUP 20. In operation, a FOUP 20 is set on the container advance assembly 606 (located at any height). If the FOUP's latch key receptacles are not aligned with the latch keys 632 when the FOUP 20 is set on the container advance assembly 606, the lead screw mechanism 610 elevates the container advance assembly 606 until the FOUP's latch key receptacles are aligned with the latch keys 632. The container advance plate 612 then moves the FOUP 20 horizontally towards the plate 602 until the FOUP's upper flange 43 and lower flange 45 each form a proximity seal with the plate 602. The port door latch keys 632 unlock the FOUP door 22 and couple the FOUP door 22 to the port door 626. The port door 626 then removes the FOUP door 22 from the FOUP 20, and moves the FOUP door 22 into the tool. The wafers stored in the FOUP 20 may then be accessed.

FIG. 27A illustrates the load port 600 in operation with a small capacity FOUP 40. In this embodiment, a pair of proximity seal plates 618 and 620 have been secured to the plate 602 to decrease the height of the plate aperture 604. Seal plate 618 is secured to the recessed surface 614 of the plate 602 by a fastener 625. Seal plate 620 is secured to the recessed surface 616 of the plate 602 by a fastener 628. The seal plates 618 and 620 may be secured to the plate 602 by other devices (e.g., bolt, screw, etc.) or may be permanently fastened to the plate 602. If the seal plates 618 and 620 are temporarily fastened to the plate 602, the load port 600 may be easily and quickly configured to operate with either a large capacity FOUP 20 or a small capacity FOUP 40 by adding and or removing the seal plates 618 and 620.

In operation, a small capacity FOUP 40 is set on the container advance assembly 606 (located at any height). If the FOUP's latch key receptacles are not aligned with the port door latch keys 632 (as shown in FIG. 27A), the lead screw mechanism 610 moves the container advance assembly 606 upward until the FOUP's latch key receptacles are aligned with the port door latch keys 632 (as shown in FIG. 28). At this point, the container advance plate 612 moves the FOUP 40 horizontally towards the plate 602.

Small capacity FOUP 40 is advanced towards the plate 602 until the top of the FOUP's upper flange 43 of the front flange and the bottom of the lower flange 45 of the front flange each form a proximity seal with a seal plate. The top of upper flange 43 of the front flange forms a proximity seal with the distal end 624 of the seal plate 620. The bottom of the lower flange 45 of the front flange forms a proximity seal with the distal end 622 of the seal plate 618. It is possible for either the front surface or top surface of the upper flange 43 or front surface or bottom surface of lower flange 45 to form a proximity seal with the seal plates.

After the latch keys 632 insert into the FOUP door latch key receptacles, the latch keys 632 unlock the FOUP door 42 and couple the FOUP door 42 to the port door 626. The port door 626 then removes the FOUP door 42 from the FOUP 40, and moves the FOUP door 42 into the tool.

The lead screw mechanism 610 shown in FIGS. 25-28, or any other actuator known within the art, may be used in conjunction with the other container support or container advance assemblies shown in FIGS. 4-25.

FIG. 27B shows an alternative to the embodiment of the load port shown in FIG. 27A. In particular, FIG. 27B includes automated upper and lower seal plates 638 and 640 that retract into slots 650 and 652, respectively. Automated upper and lower seal plates 638 and 640 are operated by automated actuators 646, 648. Other configurations for the automated seal plates are possible, as would occur to those skilled in the art.

It should be appreciated that the above-described load ports and associated mechanisms for accommodating and operating with various size FOUPs are for explanatory purposes only and that the invention is not limited thereby. Having thus described a preferred embodiment of a method of operation and load port system, it should be apparent to those skilled in the art that certain advantages of the within system have been achieved. It should also be appreciated that various modifications, adaptations, and alternative embodiments thereof may be made within the scope and spirit of the present invention. For example, the load ports and FOUPs have been illustrated and described in context of a semiconductor fabrication facility, but it should be apparent that many of the inventive concepts described above would be equally applicable to be used in connection with other non-semiconductor manufacturing applications.

What is claimed is:

1. A variable lot size load port assembly comprising:
a tool interface extending generally in a vertical dimension, the tool interface having a front surface facing a front of the tool interface, a back surface generally parallel to the front surface, and an aperture;
a port door having a closed position wherein the port door at least partially occludes the aperture and an open position wherein the aperture is substantially unobstructed by the port door;
a latch key extending from the port door, the latch key being configured to mate with a latch key receptacle of a door of a front opening unified pod (FOUP);
an advance plate positioned to the front of the tool interface below the aperture, the advance plate extending generally horizontally, and being configured to support a front opening unified pod (FOUP) and translate between a retracted position and an advanced position, the advanced position being proximate the tool interface and the retracted position being spaced from the tool interface;
an elevator for raising and lowering the advance plate, the elevator being configured to bring the latch key receptacle of the door of the FOUP into alignment with the latch key of the port door, wherein a plurality of FOUPs of varying capacities, each having a latch key receptacle at a different elevation can be accommodated by the variable lot size load port assembly by varying an elevation of the advance plate;
an upper seal plate having an upper end secured to the tool interface and a lower end covering a portion of the aperture, the upper seal plate being shaped to form a proximity seal with a front flange of the FOUP; and
a lower seal plate having a lower end secured to the tool interface and an upper end covering a portion of the aperture, the lower seal plate being shaped to provide a proximity seal with the front flange of the FOUP, wherein,
the tool interface includes a continuous recessed shoulder extending around the aperture;
the upper seal plate is mounted to the recessed shoulder, extends down, and terminates just above a top edge of the front flange of the FOUP to form the proximity seal with the front flange of the FOUP; and
the lower seal plate is mounted to the recessed shoulder, extends up, and terminates just below a lower edge of the front flange of the FOUP to form a proximity seal with the front flange of the FOUP, and
wherein the port door is sized to fit within an aperture that is smaller than a reduced aperture formed by the tool interface and the seal plate, the variable lot size load port assembly further having (a) an upper extension plate attached to the port door, the upper extension plate extending vertically up from the port door to occlude an upper portion of the aperture when the port door is in the closed position, and (b) a lower extension plate attached to the port door, the lower extension plate extending vertically down from the port door to occlude a lower portion of the aperture when the port door is in the closed position.

2. The variable lot size load port assembly of claim 1, wherein the elevator comprises an automated actuator for raising and lowering the advance plate.

3. The variable lot size load port assembly of claim 2, wherein the elevator comprises a lead screw mechanism.

4. The variable lot size load port assembly of claim 1, further comprising a replaceable static plate mounted to the tool interface, the static plate occluding a perimeter portion of the aperture, the static plate having a reduced aperture, the reduced aperture having a size and shape to form a proximity seal with a FOUP of a selected capacity.

5. A variable lot size load port assembly comprising:
a tool interface extending generally in a vertical dimension, the tool interface having a front surface facing a front of the tool interface, a back surface generally parallel to the front surface, and an aperture;
a port door having a closed position wherein the port door at least partially occludes the aperture and an open position wherein the aperture is substantially unobstructed by the port door;
a latch key extending from the port door, the latch key being configured to mate with a latch key receptacle of a door of a front opening unified pod (FOUP);
an advance plate positioned to the front of the tool interface below the aperture, the advance plate extending generally horizontally, and being configured to support a front opening unified pod (FOUP) and translate between a retracted position and an advanced position, the advanced position being proximate the tool interface and the retracted position being spaced from the tool interface; and
an elevator for raising and lowering the advance plate, the elevator being configured to bring the latch key receptacle of the door of the FOUP into alignment with the latch key of the port door, wherein a plurality of FOUPs of varying capacities, each having a latch key receptacle at a different elevation can be accommodated by the variable lot size load port assembly by varying an elevation of the advance plate, further comprising an extension plate mounted to the port door, the extension plate having an internal aperture through which the latch key extends, the extension plate extending vertically up from the port door and down from the port door to occlude at least upper and lower portions of the aperture not occluded by the port door, the extension plate having a size and shape matching a size and shape of a door of a FOUP of a selected capacity.

6. A variable lot size load port assembly comprising:
a tool interface extending generally in a vertical dimension, the tool interface having a front surface facing a front of the tool interface, a back surface generally parallel to the front surface, and an aperture;
a port door having a closed position wherein the port door at least partially occludes the aperture and an open position wherein the aperture is substantially unobstructed by the port door;
a latch key extending from the port door, the latch key being configured to mate with a latch key receptacle of a door of a front opening unified pod (FOUP);
an advance plate positioned to the front of the tool interface below the aperture, the advance plate extending generally horizontally, and being configured to support a front opening unified pod (FOUP) and translate between a retracted position a advanced position, the advanced position being proximate the tool interface and the retracted position being spaced from the tool interface; and
a replaceable static plate mounted to the tool interface, the static plate occluding a perimeter portion of the aperture, the static plate having a reduced aperture, the reduced aperture having a size and shape to form a proximity seal with a FOUP of a selected capacity; further comprising an extension plate mounted to the port door, the extension plate having an internal aperture through which the latch key extends, the extension plate extending vertically up from the port door and down from the port door to occlude at least upper and lower portions of the aperture not occluded by the port door, the extension plate having a size and shape matching a size and shape of a door of a FOUP of a selected capacity.

7. The variable lot size load port assembly of claim 6, further comprising an elevator for raising and lowering the advance plate so that the door of the FOUP is aligned with the reduced aperture.

* * * * *